US010985254B2

(12) United States Patent
Tsai

(10) Patent No.: US 10,985,254 B2
(45) Date of Patent: Apr. 20, 2021

(54) SEMICONDUCTOR DEVICE AND METHOD OF MANUFACTURING THE SAME

(71) Applicant: NANYA TECHNOLOGY CORPORATION, New Taipei (TW)

(72) Inventor: Jhen-Yu Tsai, Kaohsiung (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/457,023

(22) Filed: Jun. 28, 2019

(65) Prior Publication Data
US 2020/0411654 A1 Dec. 31, 2020

(51) Int. Cl.
H01L 29/423 (2006.01)
H01L 21/265 (2006.01)
H01L 21/762 (2006.01)
H01L 29/40 (2006.01)

(52) U.S. Cl.
CPC ........ *H01L 29/4236* (2013.01); *H01L 21/265* (2013.01); *H01L 21/76224* (2013.01); *H01L 29/401* (2013.01); *H01L 29/42376* (2013.01)

(58) Field of Classification Search
CPC . H01L 29/4236; H01L 29/401; H01L 21/265; H01L 29/42376; H01L 21/76224
USPC ........................................................ 257/330
See application file for complete search history.

(56) References Cited

U.S. PATENT DOCUMENTS 6,187,641 B1 2/2001 Rodder et al.
8,716,768 B2 5/2014 Lyu et al.
2004/0016972 A1* 1/2004 Singh ................ H01L 29/42316
257/367
2013/0099296 A1* 4/2013 Lyu ........................ H01L 21/761
257/291
2018/0240908 A1* 8/2018 Amari ................ H01L 29/7827
2019/0067138 A1* 2/2019 Lo ........................... H01L 23/13

FOREIGN PATENT DOCUMENTS

CN 101641792 A 2/2010

OTHER PUBLICATIONS

Office Action dated Mar. 10, 2020, 2020 related to Taiwanese Application No. 10812716.
Igor Polishchuk, et al., "Dual Work Function Metal Gate CMOS Technology Using Metal Interdiffusion," IEEE Electron Device Letters, vol. 22, No. 9, Sep. 2001, pp. 444-446.
Kee-Yeol Na et al., "Silicon Complementary Metal—Oxide—Semiconductor Field-Effect Transistors with Dual Work Function Gate," Japanese Journal of Applied Physics, vol. 45, No. 12, Dec. 2006, pp. 9033-9036.
Enrico Gili, et al., "Asymmetric Gate-Induced Drain Leakage and Body Leakage in Vertical MOSFETs With Reduced Parasitic Capacitance," IEEE Transactions on Electron Devices, vol. 53, No. 5, May 2006, pp. 1080-1086.

(Continued)

*Primary Examiner* — Caleen O Sullivan
(74) *Attorney, Agent, or Firm* — Muncy, Geissler, Olds & Lowe, P.C.

(57) ABSTRACT

The present disclosure provides a semiconductor device. The semiconductor device includes a substrate, a source region, a drain region, and a gate electrode. The source region and the drain region are in the substrate, and the gate electrode is partly buried in the substrate and between the source region and the drain region.

8 Claims, 29 Drawing Sheets

(56) References Cited

OTHER PUBLICATIONS

Rishu Chaujar et al., "TCAD Assessment of Gate Electrode Workfunction Engineered Recessed Channel (GEWE-RC) MOSFET and Its Multilayered Gate Architecture—Part I: Hot-Carrier-Reliability Evaluation," IEEE Transactions on Electron Devcies, vol. 55, No. 10, Oct. 2008, p. 2602-2613.

* cited by examiner

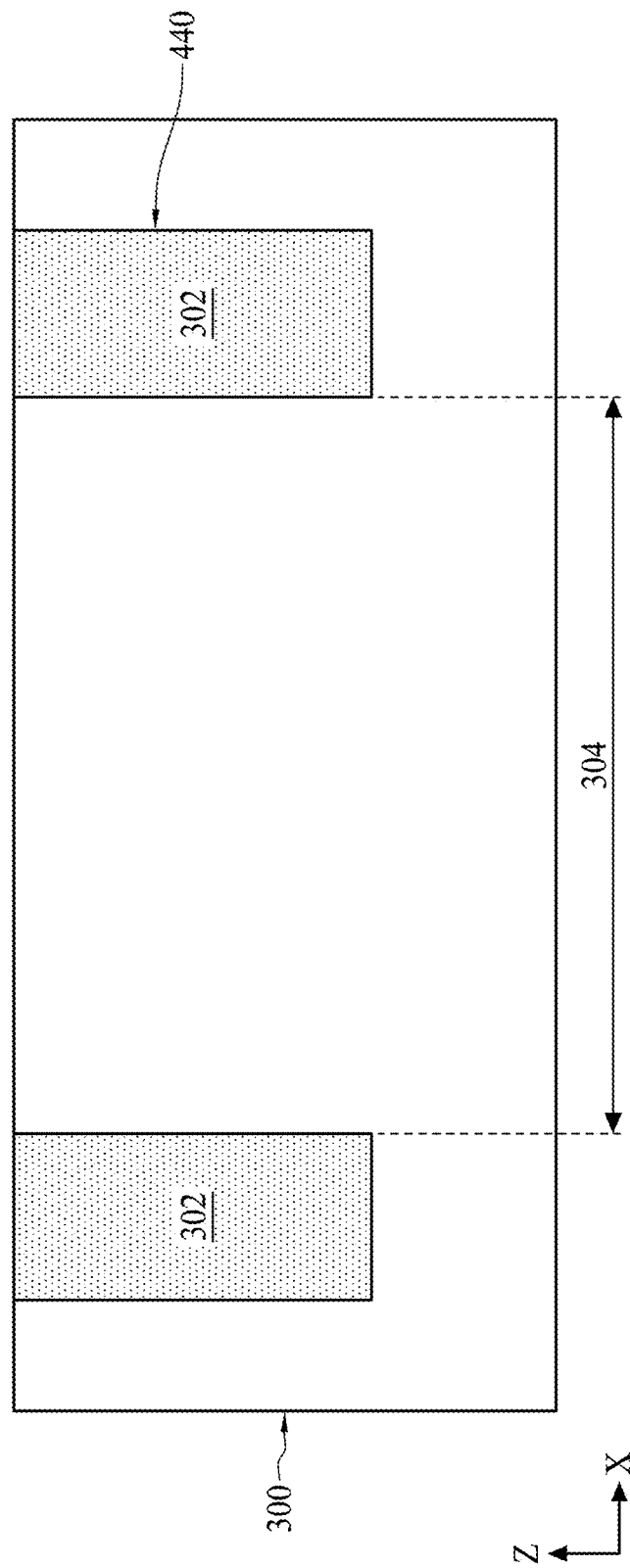

SEMICONDUCTOR DEVICE AND METHOD OF MANUFACTURING THE SAME

TECHNICAL FIELD

The present disclosure relates to a semiconductor device and a method of manufacturing the same, and more particularly, to a transistor and a method of manufacturing the same.

DISCUSSION OF THE BACKGROUND

In the fabrication of integrated circuits, as the sizes of semiconductor devices, such as metal oxide semiconductor field effect transistors (MOSFETs), are scaled down, performance issues arise regarding the current driving capabilities of these devices. Since the current driving capability is a function of both source resistance and gate oxide thickness, better performance in these devices is achievable through thinner gate oxide and spacer layers. However, it has been observed that as the gate oxide is made thinner, gate-induced drain leakage (GIDL) occurs. In logic circuits, GIDL increases standby power requirement, and in a dynamic random access memory (DRAM) array, GIDL reduces data retention time.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a source region, a drain region, and a gate electrode. The source region and the drain region are in the substrate, and the gate electrode is partly buried in the substrate between the source region and the drain region.

In some embodiments, the gate electrode is substantially U shaped.

In some embodiments, the semiconductor device further includes an isolating structure in the substrate to define an active area, wherein the gate electrode is partly buried in the isolating structure.

In some embodiments, the portion of the gate electrode in the substrate has a first width, and the portion of the gate electrode above the substrate has a second width substantially greater than the first width.

In some embodiments, the gate electrode comprises a first gate segment and at least one second gate segment attached to the first gate segment, wherein the first gate segment and the second gate segment have different work functions.

In some embodiments, a difference between the work functions is substantially 0.2 eV.

In some embodiments, the first gate segment and the second gate segment are made of a same material having different doped concentrations.

In some embodiments, the gate electrode includes a plurality of second gate segments on either side of the first gate segment.

In some embodiments, the second gate segment is attached to a lateral side of the first gate segment, and top surfaces of the first gate segment and the second gate segment are at the same level.

In some embodiments, the second gate segment is attached to a lateral side of the first gate segment, and the second gate segment covers the first gate segment.

Another aspect of the present disclosure provides a method of manufacturing a semiconductor device. The method includes steps of forming a recess in the substrate; depositing an insulating layer on the substrate; forming a gate electrode on the insulating layer and partly buried in the recess; removing a portion of the insulating layer exposed through the gate electrode to form a gate dielectric; and implanting dopants in the substrate to form a source region and a drain region on either side of the gate electrode.

In some embodiments, the method further includes a step of forming at least one isolating structure in the substrate to define an active area, wherein the source region and the drain region are in the active area, and the gate electrode extends from the active area to the isolating structure.

In some embodiments, the forming of the gate electrode on the insulating layer and partly buried in the recess includes steps of depositing a first conductive material on the insulating layer; patterning the first conductive material to form a first gate segment partly filling the recess extending from the active area to the insulating structure; depositing a second conductive material on the portion of the insulating layer exposed through the first gate segment and the first gate segment; and patterning the second conductive material to for form a second gate segment attached to a planar lateral side of the first gate segment and partly buried in the recess, wherein the first gate segment and the second gate segment have different work functions.

In some embodiments, the method further includes a step of performing a planarizing process to expose the first gate segment.

In some embodiments, the forming of the gate electrode on the insulating layer and partly buried in the recess includes steps of depositing a first conductive material on the insulating layer; patterning the first conductive material to form a first gate segment in the active area and partly filling the recess; depositing a second conductive material on the portion of the insulating layer exposed through the first gate segment and the first gate segment; and patterning the second conductive material to form a plurality of second gate segments partly buried in the recess and attached to either side of the first gate segment along a longitudinal direction, wherein the first gate segment and the second gate segment have different work functions.

In some embodiments, the method further includes steps of forming gate spacers on sidewalls of the first gate segment; and forming lightly-doped drains by implanting dopants after the forming of the gate electrode but prior to the forming of the gate spacers using the gate electrode and the gate spacers as a mask.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 10 through 16 are cross-sectional views of intermediate stages in the formation of a semiconductor structure in accordance with some embodiments of the present disclosure.

DETAILED DESCRIPTION

Figure 1A:
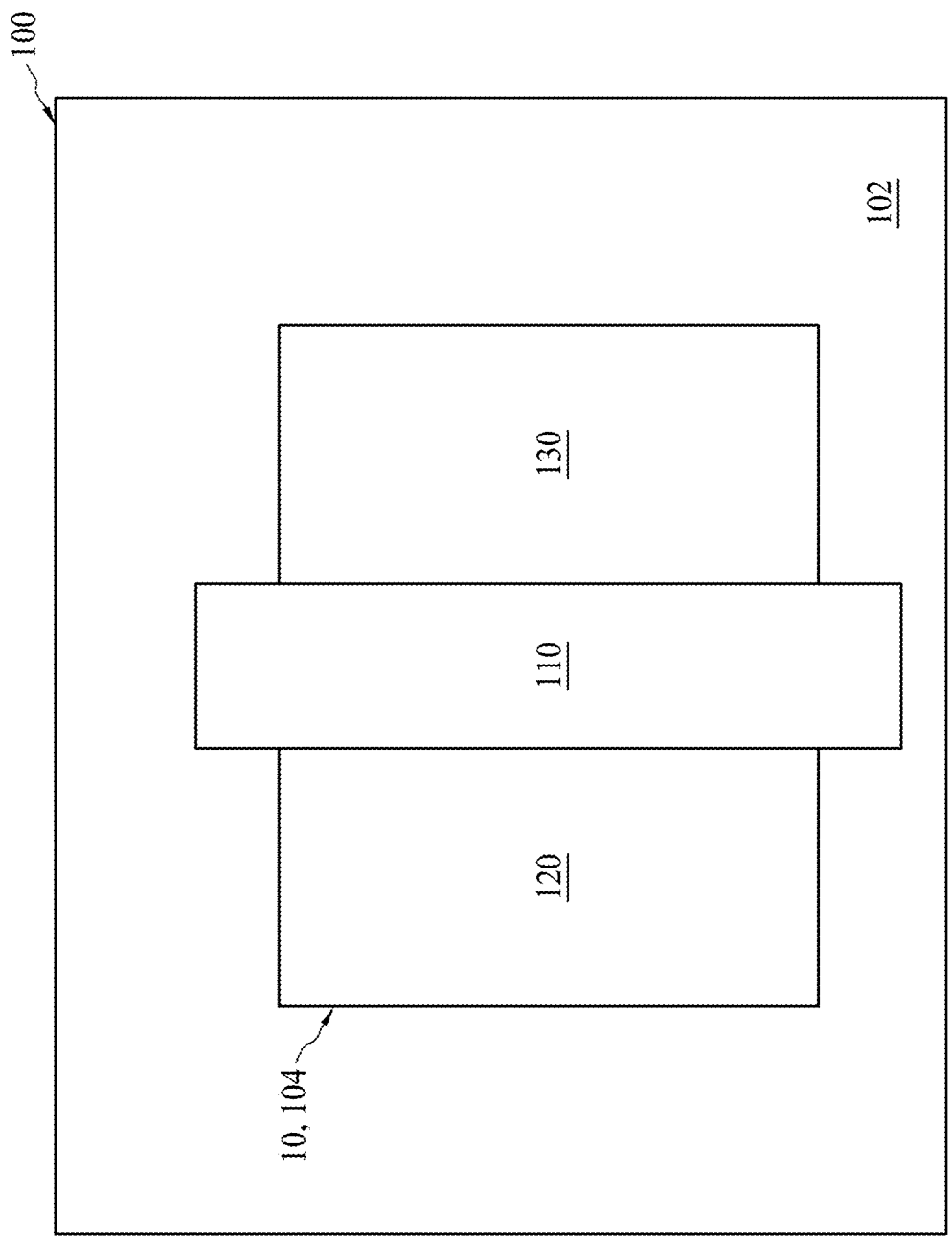
FIG. 1A is a top view of a comparative transistor.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
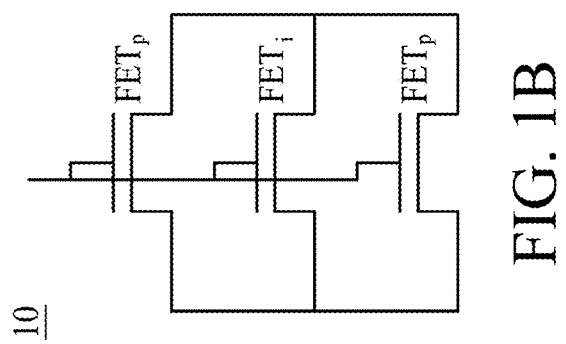
FIG. 1B is a schematic diagram of the transistor shown in FIG. 1.

FIG. 1A is a top view of a comparative transistor 10. Referring to FIG. 1A, the transistor 10 is formed on a substrate 100 and surrounded by an isolating structure 102, and includes a gate electrode 110, a source region 120 and a drain region 130; the gate electrode 110 is over the substrate 100 and is located between the source region 120 and the drain region 130. The isolating structure 102, such as a shallow trench isolation (STI) structure, is in the substrate 100 and isolates an active area 104 over which the transistor 10 is formed. With the shallow trench isolation, the abrupt transition from the isolating structure 102 to the active area 104 induces an impurity segregation and a fringe electrical field. The STI edge effect on the transistor 10 leads to a local decrease in threshold voltage resulting in an increase in leakage current near the edge. The edge-leakage current corresponds to the transfer characteristics of the parasitic transistors (FETp) operating in parallel with the intrinsic transistor (FETi) formed at the center of the transistor 10, as shown in FIG. 1B.

Figure 2:
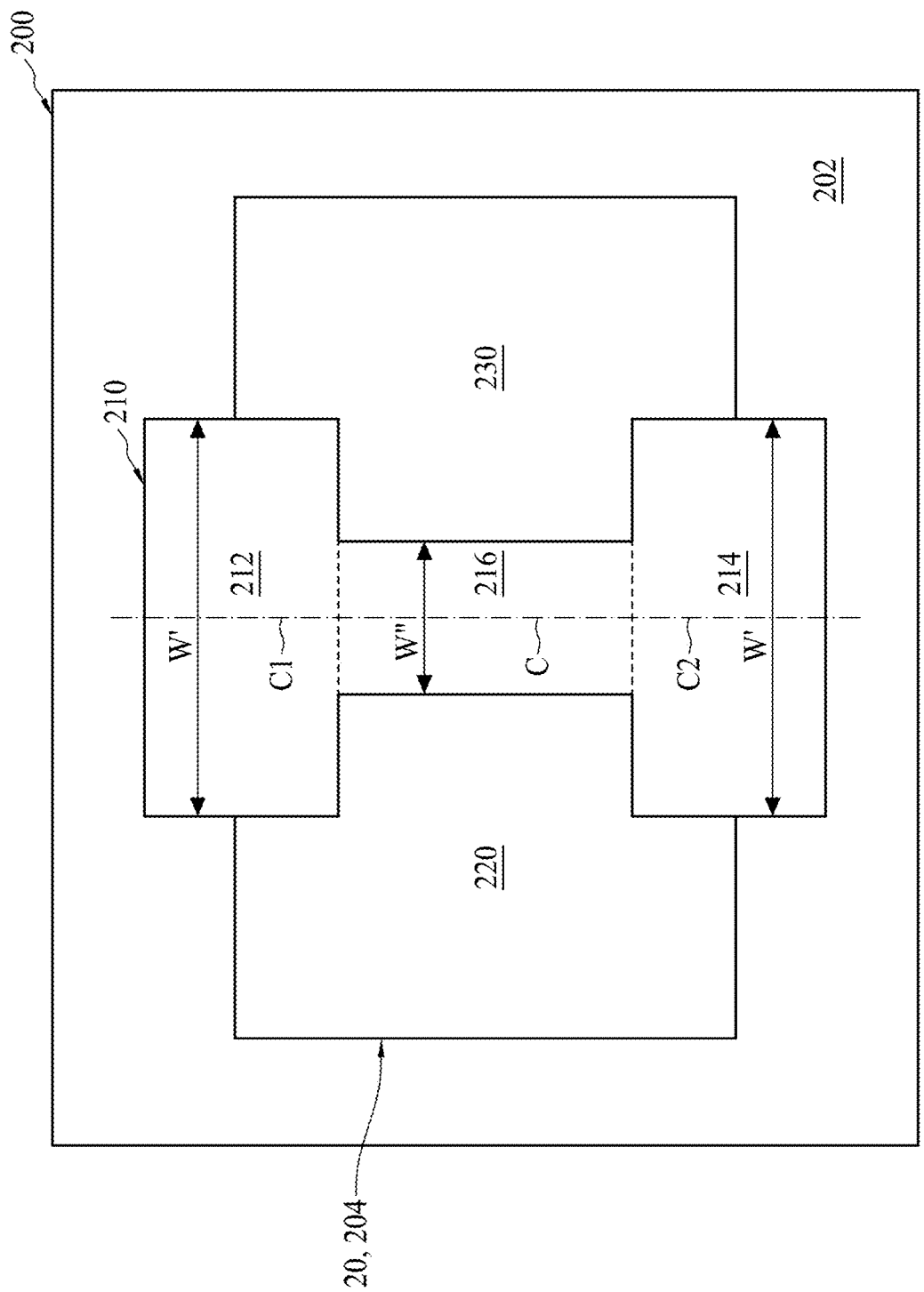
FIG. 2 is a top view of a comparative transistor.

FIG. 2 is a top view of another comparative transistor 20. Referring to FIG. 2, the transistor 20, formed on a substrate 200 and surrounded by an isolation structure 202, includes an H-shaped gate electrode 210 over the substrate 200, and a source region 220 and a drain region 230 in the substrate 200. The H-shape gate electrode 210, between the source region 220 and the drain region 230, includes a first member 212, a second member 214 substantially parallel to the first member 212, and a cross member 216 running substantially perpendicular to the first member 212 and the second member 214 and connecting the first member 212 to the second member 214. A central line C of the cross member 216 coincides with central lines C1, C2 of the first member 212 and the second member 214.

As shown in in FIG. 2, widths W' of the first member 212 and the second member 214 are designed to be greater than a width W" of the cross member 216 to suppress a leakage current cause by the shallow trench isolation (STI). However, the H-shaped gate 210 occupies a large footprint and reduces the driving current when logic circuits including the transistor 20 are in operation.

Figure 3:
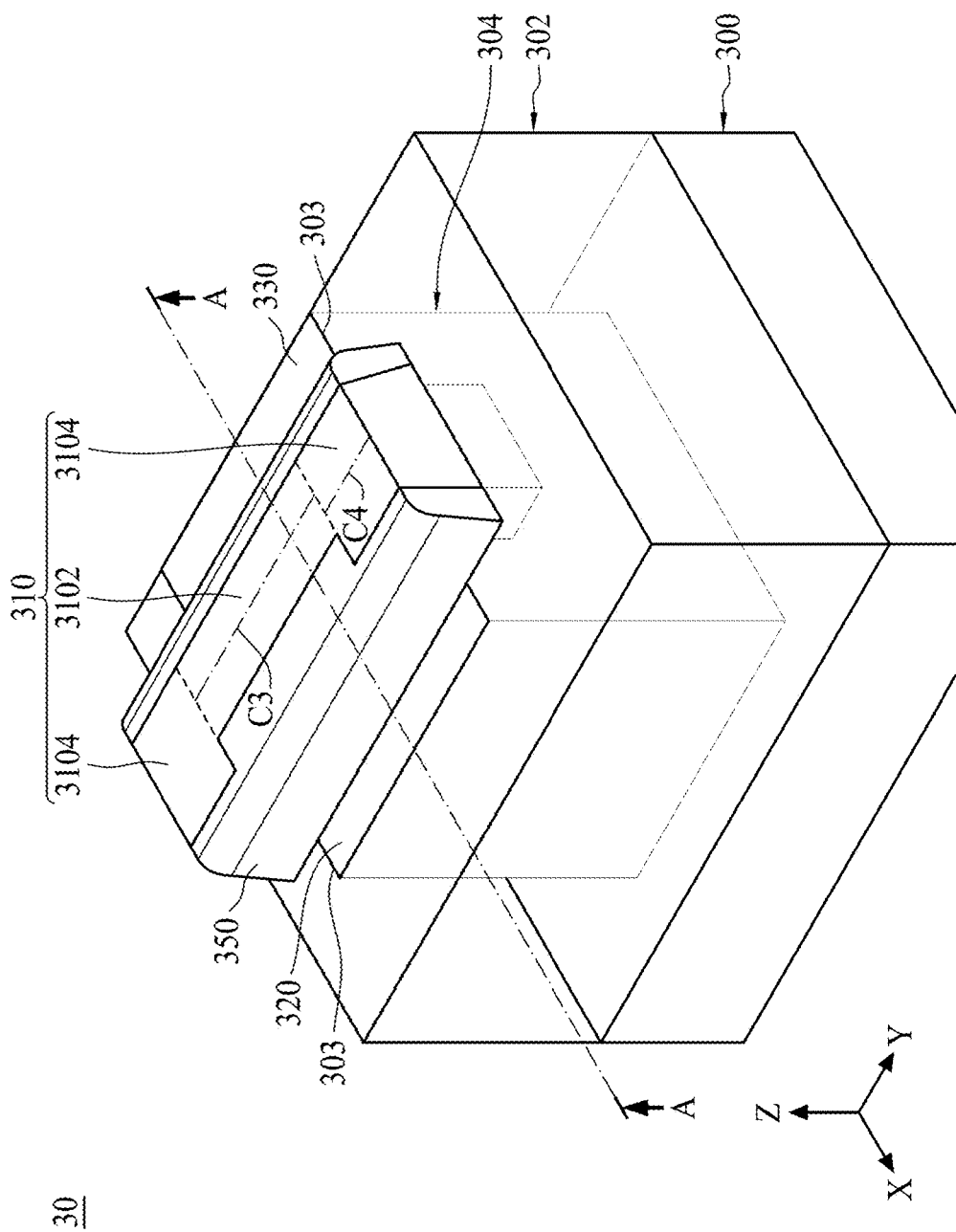
FIG. 3 is a perspective view of a semiconductor device in accordance with some embodiments of the present disclosure.
Figure 4:
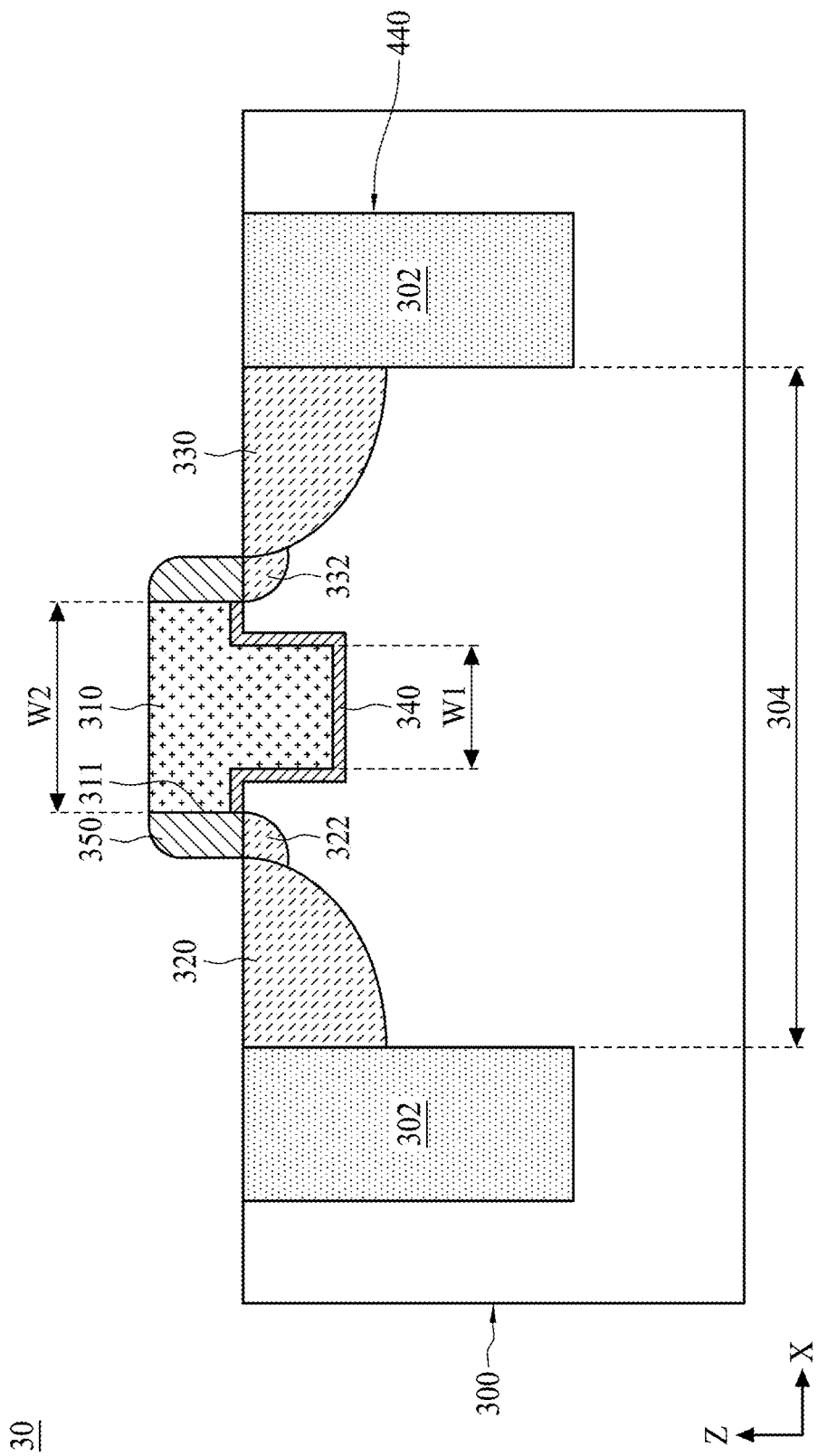
FIG. 4 is a cross-sectional view taken along the line A-A illustrated in FIG. 3.

FIG. 3 is a perspective view of a semiconductor device 30 in accordance with some embodiments of the present disclosure, and FIG. 4 is a cross-sectional view taken along line A-A in FIG. 3. Referring to FIGS. 3 and 4, the semiconductor device 30 is formed on a substrate 300 and includes a U-shaped gate electrode 310, and a source region 320 and a drain region 330 on either side of the gate electrode 310. The semiconductor device 30 further includes a gate dielectric 340 disposed between the gate electrode 310 and the substrate 300 to maintain the capacitive coupling of the gate electrode 310 and a conductive channel between the source region 320 and the drain region 330. The gate dielectric 350 may include oxide, nitride, oxynitride or high-k dielectric.

In some embodiments, at least one isolating structure 302 is disposed in the substrate 300 to define an active area 304 where the source region 320, the drain region 330 and a portion of the gate electrode 310 are disposed. In other words, some portions of the gate electrode 310 extend to the isolating structure 302. In some embodiments, the active area 304 has an island shape delimited by the isolating structure 302. As shown in FIG. 4, the portion of the gate electrode 310 buried in the substrate 300 and the isolating structure 302 has a first width W1, and the portion of the gate electrode 310 above the substrate 300 and the isolating structure 302 has a second width W2 greater than the first width W1. In some embodiments, the gate electrode 310 may include, but is not limited to, doped polysilicon, metal-containing material comprising tungsten, titanium, or metal silicide.

In some embodiments, the semiconductor device 30 may further include gate spacers 350 on sidewalls 311 of the gate electrode 310. In some embodiments, doped extension regions 322, 332 are introduced in the substrate 300 on either side of the gate electrode 310. The doped extension regions 322, 332 are lightly doped regions introduced into the substrate 300 by ion implantation using the gate electrode 310 as an implant mask. As shown in the FIG. 3, the gate electrode 310 includes a first portion 3102 and a plurality of second portions 3104 disposed at two opposite ends of the first portion 3102 and physically in contact with the first portion 3102. In other words, the first portion 3102 is disposed between the second portions 3014, and the first portion 3102 connects the second portions 3104. The second portion 3104 of the gate electrode 310 overlaps at least one boundary 303 between the active region 304 and the isolating structure 302. In some embodiments, the second portions 3104 cross the active area 304 and overlap the boundary 303 between the active area 304 and the isolating structure 302. In some embodiments, the first portion 3102 and the second portion 3104 are integrated formed. In some embodiments, a central line C3 of the first portion 3102 is offset from a central line C4 of the second portions 3104. The semiconductor device 30 of the present disclosure includes the U-shaped gate electrode 310 having the second portions 3104 overlapping the boundary 303 between the active area 304 and the isolating structure 302 to reduce its footprint and suppress a leakage current caused by the shallow trench isolation.

Figure 5:
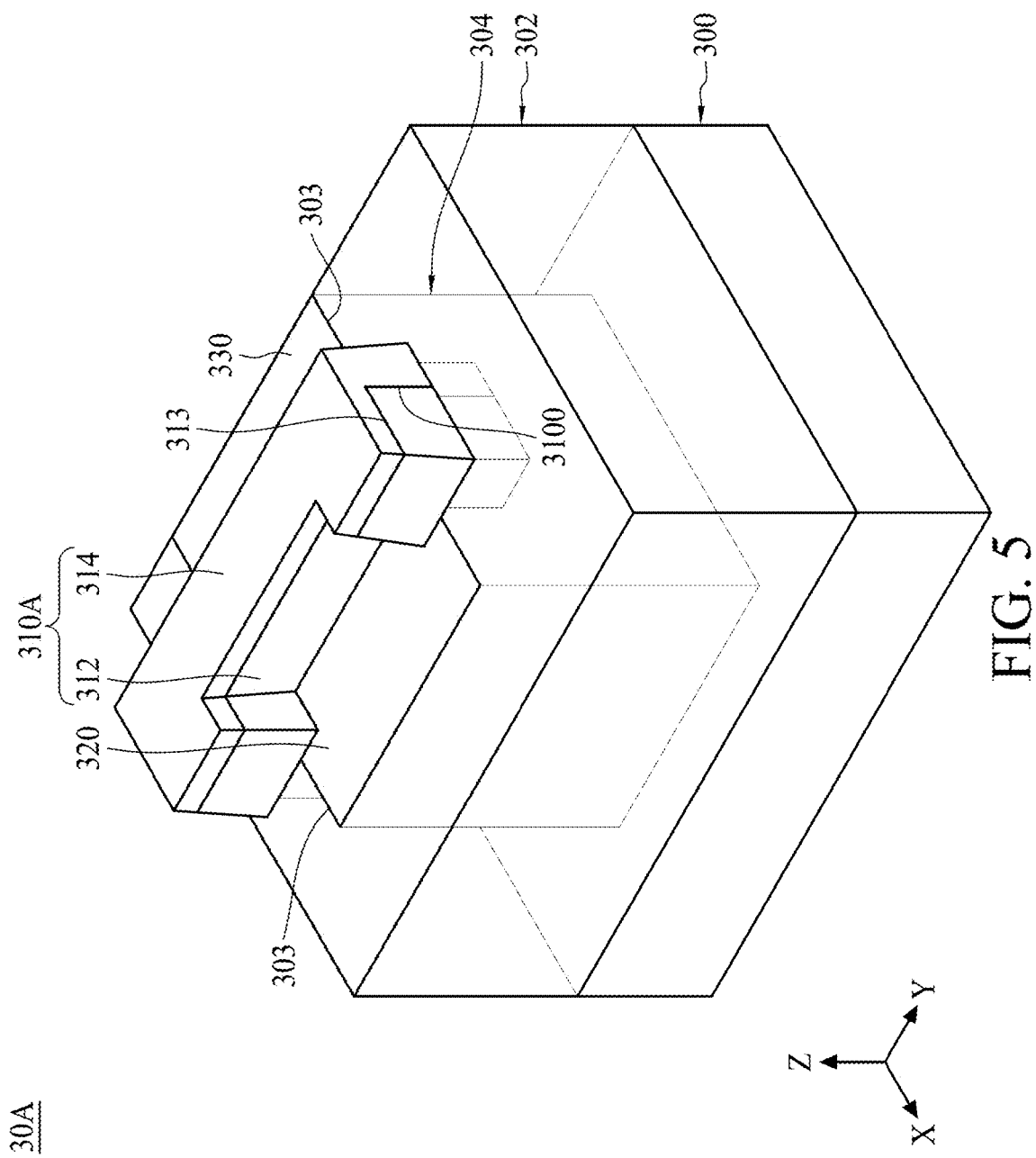
FIG. 5 is a perspective view of a semiconductor device in accordance with some embodiments of the present disclosure.

FIG. 5 is a perspective view of a semiconductor device 30A in accordance with some embodiments of the present disclosure. Referring to FIG. 5, the semiconductor device 30A includes at least one U-shaped gate electrode 310A, and a source region 320 and a drain region 330 on either side of the gate electrode 310A. The gate structure 310A crosses an active region 302 and overlaps at least one boundary 303 between the active area 304 and an isolating structure 302. The gate electrode 310A includes a first gate segment 312 and a second gate segment 314 attached to a planar lateral side 3100 of the first gate segment 312 and covering a top surface 313 of the first gate segment 312. In some embodiments, the first gate segment 312 and the second gate segment 314 are buried partly within an isolating structure 302 in a substrate 300 and buried partly within an active area 304 surrounded by the isolating structure 302. The first gate segment 312 is made of a conductive material having a first work function, and the second gate segment 314 is made of a conductive material having a second work function different from the first work function. In some embodiments, the first gate segment 312 and the second gate segment 314 may be made of polysilicon having different doped concentrations.

Figure 6:
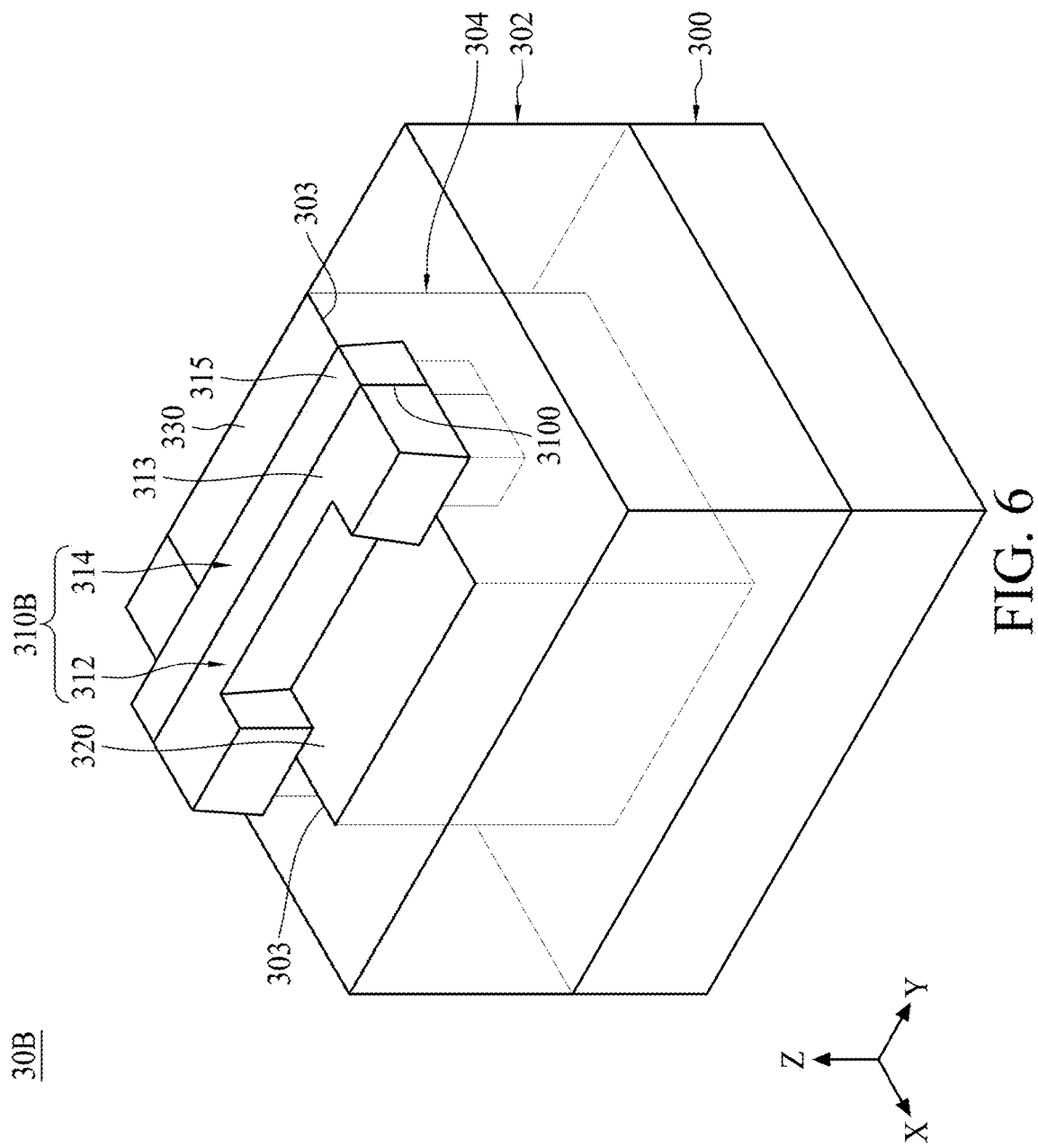
FIG. 6 is a perspective view of a semiconductor device in accordance with some embodiments of the present disclosure.

FIG. 6 is a perspective view of a semiconductor device 30B in accordance with some embodiments of the present disclosure. Referring to FIG. 6, the semiconductor device 30B includes a U-shaped gate electrode 310B, and a source region 320 and a drain region 330 on either side of the gate electrode 310B. The gate structure 310B crosses an active region 302 and overlaps at least one boundary 303 between the active area 304 and an isolating structure 302. The gate electrode 310B includes a first gate segment 312 and a second gate segment 314 attached to a planar lateral side 3100 of the first gate segment 312, wherein a top surface 313 of the first gate segment 312 is coplanar with a top surface 315 of the second gate segment 314. In some embodiments, the first gate segment 312 and the second gate segment 314 are buried partly within an isolating structure 302 in a substrate 300 and buried partly within an active area 304 surrounded by the isolating structure 302. In some embodiments, the first gate segment 312 and the second gate segment 314 may be made of metal-containing materials having different work functions or polysilicon with different doped concentrations.

Figure 7:
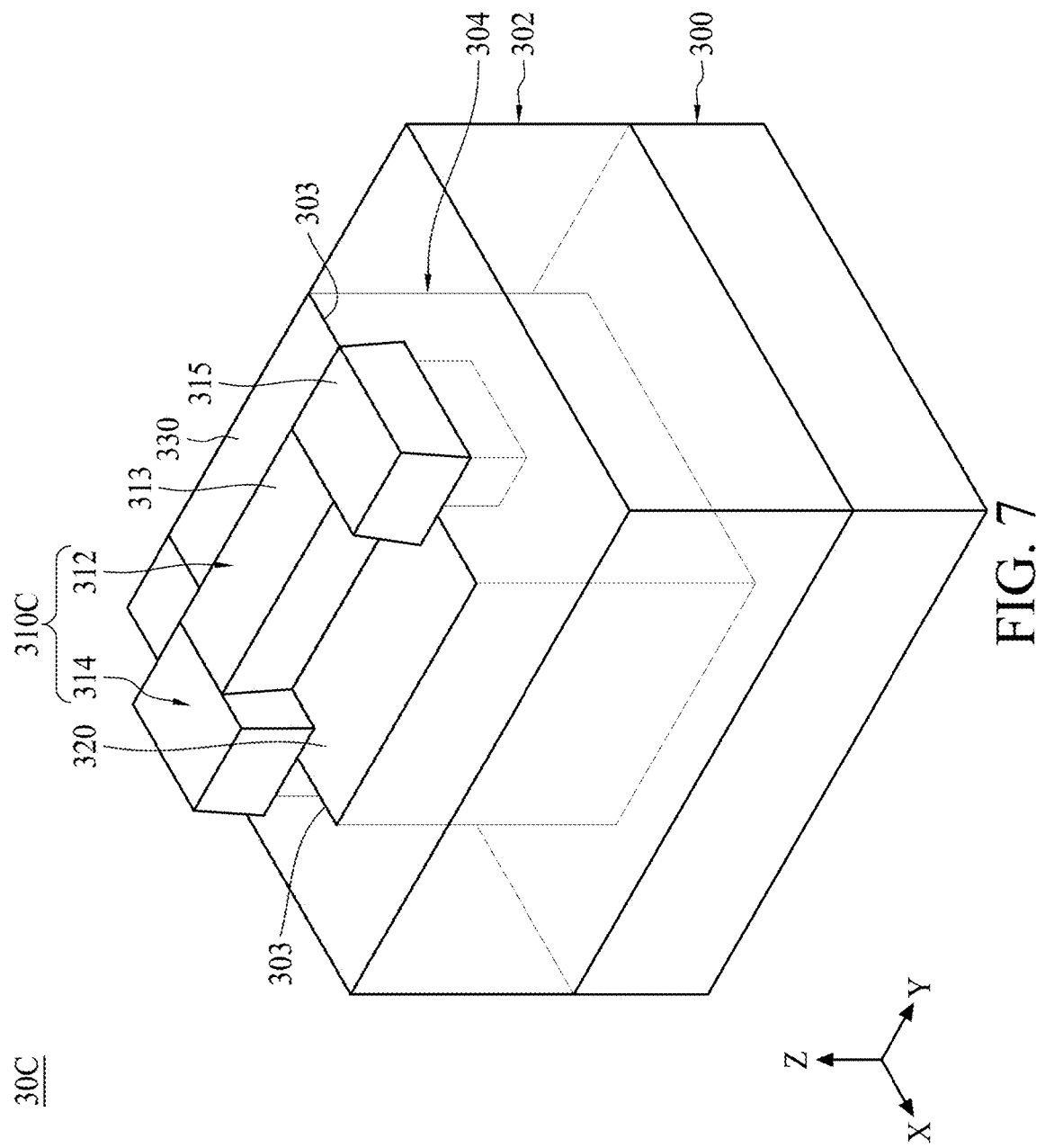
FIG. 7 is a perspective view of a semiconductor device in accordance with some embodiments of the present disclosure.

FIG. 7 is a perspective view of a semiconductor device 30C in accordance with some embodiments of the present disclosure. Referring to FIG. 7, the semiconductor device 30C includes a substrate 300, a U-shaped gate electrode 310C, and a source region 320 and a drain region 330 on either side of the gate electrode 310C. The gate structure 310C crosses an active region 302 and overlaps a boundary 303 between the active area 304 and an isolating structure 302. The gate electrode 310C includes a first gate segment 312 buried in an active area 304 defined by an isolating structure 302 in the substrate 300. The gate electrode 310C further includes a plurality of second gate segments 314 attached to either of the longer sides of the first gate segment 312. In some embodiments, a top surface 313 of the first gate segment 312 is coplanar with a top surface 315 of the second gate segments 314. In some embodiments, the second gate segments 314 are buried partly within the isolating structure 302 and partly within the active area 304. In some embodiments, the first gate segment 312 and the second gate segments 314 may be made of metal-containing materials having different work functions or polysilicon with different doped concentrations. In some embodiments, the work functions of the material for making the first gate segment 312 and the second gate segments 314 are in a range between 4 and 5 eV. In some embodiments, a difference between the work functions of the materials is about 0.2 eV.

Figure 8A:
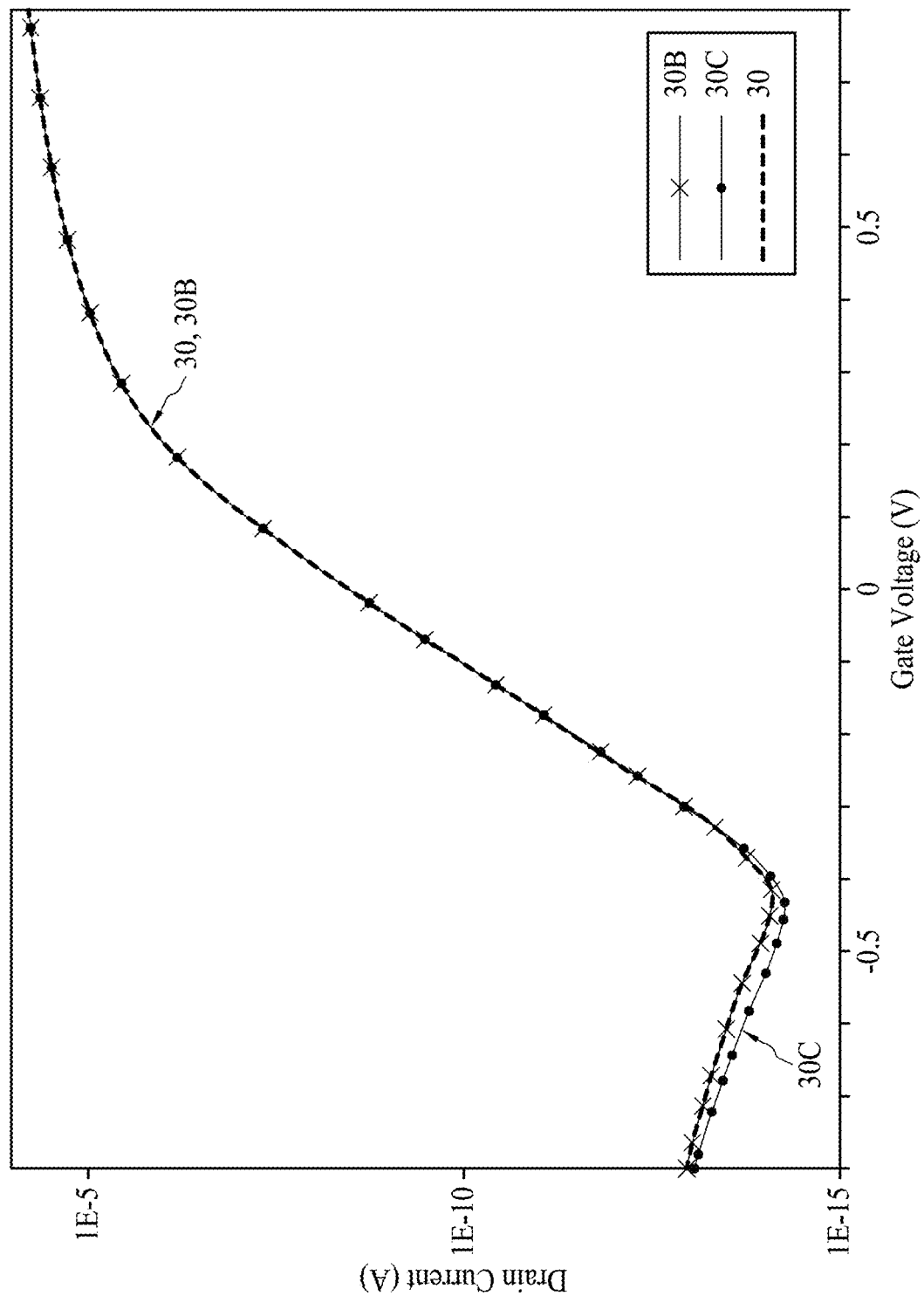
FIGS. 8A and 8B are graphs of drain current characteristic of semiconductor devices in accordance with some embodiments of the present disclosure.
Figure 8B:
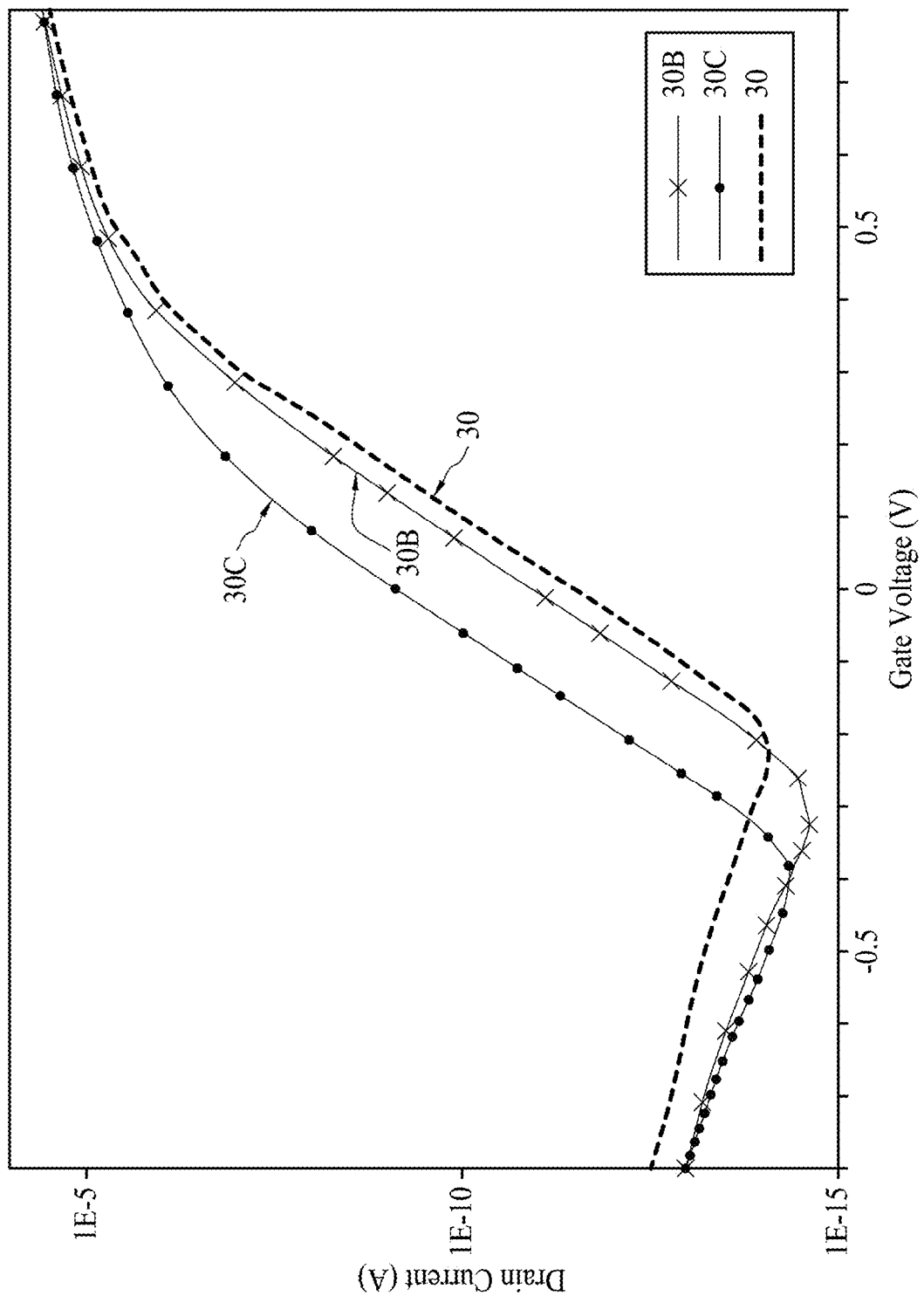

FIGS. 8A and 8B are graphs of drain current characteristic of semiconductor devices 30, 30B and 30C in accordance with some embodiments of the present disclosure. The plots in FIGS. 8A and 8B were obtained by simulating a drain current and a gate voltage of the semiconductor devices 30, 30B and 30C. In FIG. 8A, the difference of the work functions of the first gate member 312 and the second gate member 314 of the semiconductor device 30B/30C is much less than 0.2 eV; the characteristics of the semiconductor devices 30 and 30B are similar and semiconductor device 30C has better GIDL than the semiconductor devices 30 and 30B. In FIG. 8B, the difference of the work functions of the first gate member 312 and the second gate member 314 of the semiconductor device 30B/30C is about 0.2 eV, and the semiconductor device 30B and 30C present better GIDL than semiconductor device 30.

Figure 9:
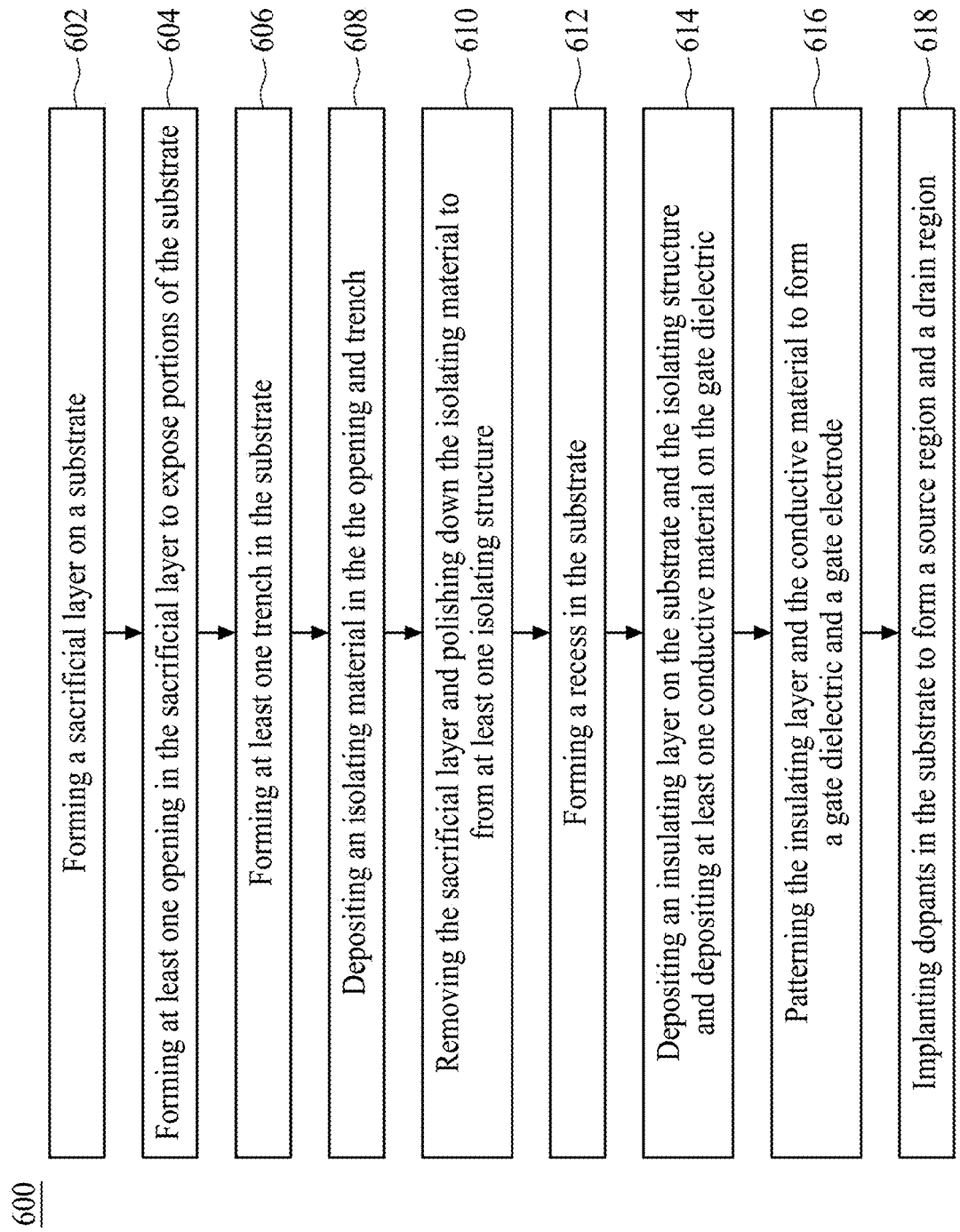
FIG. 9 is a flow diagram illustrating a method of manufacturing a semiconductor device in accordance with some embodiments of the present disclosure.

FIG. 9 is a flow diagram illustrating a method 600 of manufacturing a semiconductor device 30 in accordance with some embodiments of the present disclosure. FIGS. 10 to 16 are schematic diagrams illustrating various fabrication stages constructed according to the method 600 for manufacturing the semiconductor device 30 in accordance with some embodiments of the present disclosure. The stages shown in FIGS. 10 to 16 are also illustrated schematically in the flow diagram in FIG. 9. In the subsequent discussion, the fabrication stages shown in FIGS. 10 to 16 are discussed in reference to the process steps shown in FIG. 9.

Figure 10:
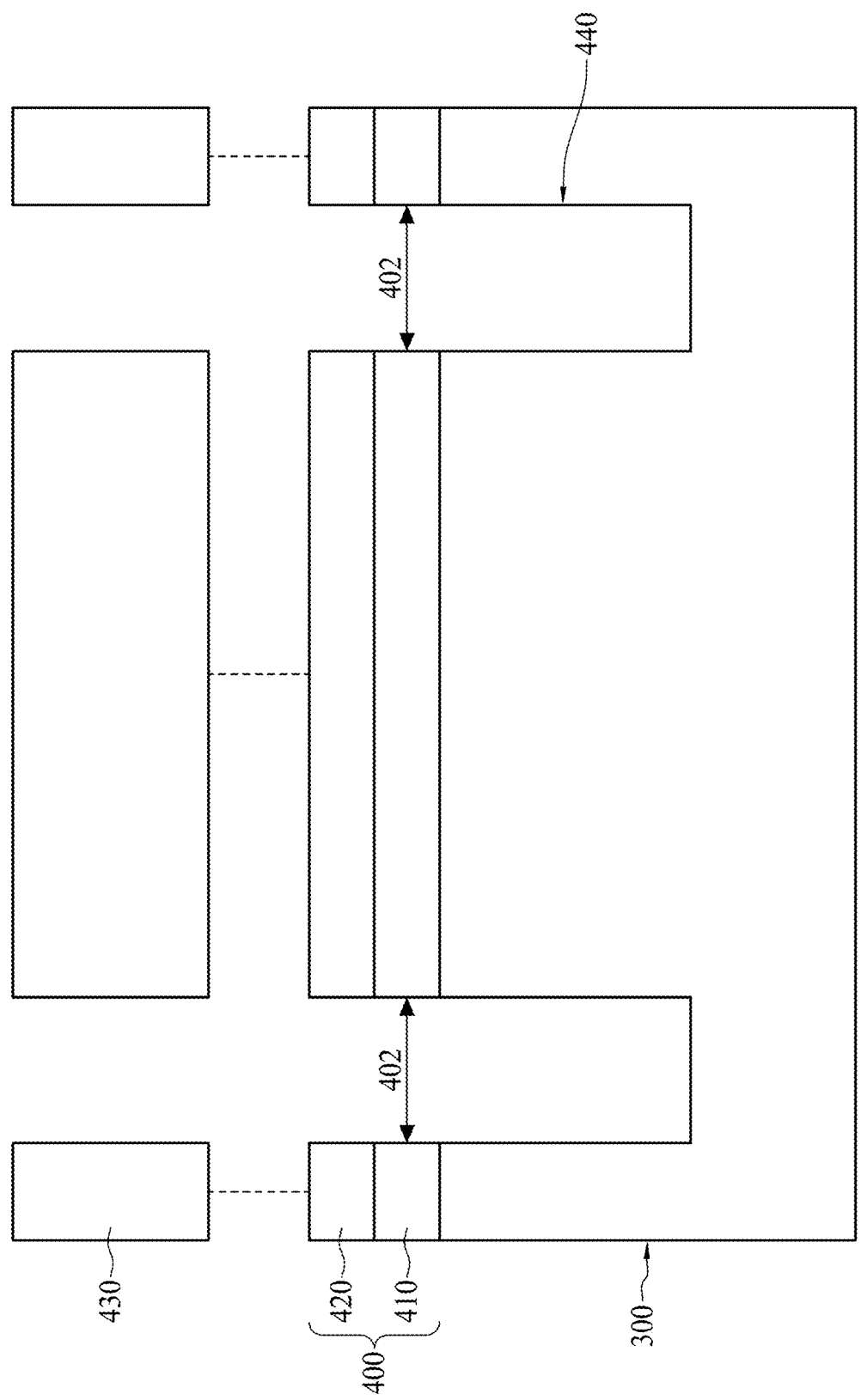

Referring to FIG. 10, in some embodiments, a sacrificial layer 400 is formed on a substrate 300 according to a step 602 in FIG. 9. In some embodiments, the sacrificial layer 400 includes an underlying film 410 of oxide and an overlying film 420 of nitride sequentially deposited on the substrate 300. The underlying film 410, functioning as a buffer layer for mitigating stress between the substrate 300 and the overlying film 420, can be conformally formed using a chemical vapor deposition (CVD) process or a thermal oxidation process, and the overlying film 420 is conformally formed using a low-pressure CVD process. In some embodiments, the substrate 300 may be a monocrystalline silicon, while in other embodiments, the substrate 300 may include other materials including, for example, germanium, silicon-germanium, or the like.

Next, one or more openings 402 are formed in the sacrificial layer 400 to expose portions of the substrate 300 according to a step 604 in FIG. 9. In some embodiments, the forming of the openings 402 includes steps of coating a first etching mask 430 on the sacrificial layer 400 that leave portions of the overlying layer 420 exposed, and performing a first etching process to remove portions of the sacrificial layer 400 not protected by the first etching mask 430. In some embodiments, the first etching process may utilize multiple etchants selected based on the materials of the overlying layer 420 and the underlying layer 410 being etching to etch the sacrificial layer 400. In some embodiments, the overlying layer 420 and the underlying layer 410 are anisotropically dry-etched, using a reactive ion etching (RIE) process, for example, through the first etching mask 430 to form the one or more openings 402. In some embodiments, the first etching mask 430 is removed after the performing of the first etching process using an ashing process or a wet strip process, for example.

Next, one or more trenches 440 are formed in the substrate 300 according to a step 606 in FIG. 9. In some embodiments, the trench 440 is dry-etched through the opening 402 to form the trenches 440 in the substrate 300. In some embodiments, the portions of the substrate 300 are removed and thus the trenches 440 are formed by, for example, an RIE process, using the pattern in the sacrificial layer 420 as a hard mask.

Referring to FIG. 11, in some embodiments, an isolating material is deposited in the openings 402 and the trenches 440 according to a step 608 in FIG. 9. In some embodiments, the isolating material is disposed using, for example, a low-pressure CVD process or a high-density plasma process, so that the isolating material not only fills in the opening 402 and the trenches 440 but also covers the sacrificial layer 400. Therefore, a polish process can be performed to remove the isolating material above the sacrificial layer 400 after the deposition of the isolating material. The isolating material above the sacrificial layer 400 may be polished using, for example, a chemical mechanical polishing (CMP) process.

Next, the sacrificial layer 400 is removed and the isolating material is polished down to form one or more isolating structures 302 according to a step 610 in FIG. 9. In some embodiments, a typical hot phosphoric acid ($H_3PO_4$) wet etch is used to remove the overlying layer 420 without etching the underlying layer 410 or the isolating material including silicon oxide, silicon nitride, silicon oxynitride, fluoride-doped silicate glass (FSG), a low-K dielectric material, and/or the combination thereof. In some embodiments, the underlying layer 410 and the isolating material are polished, using a CMP process for example, to expose the substrate 300. The isolating structures 302 are formed to define and electrically isolate an active region 304 for subsequent formation of a transistor.

Figure 12A:
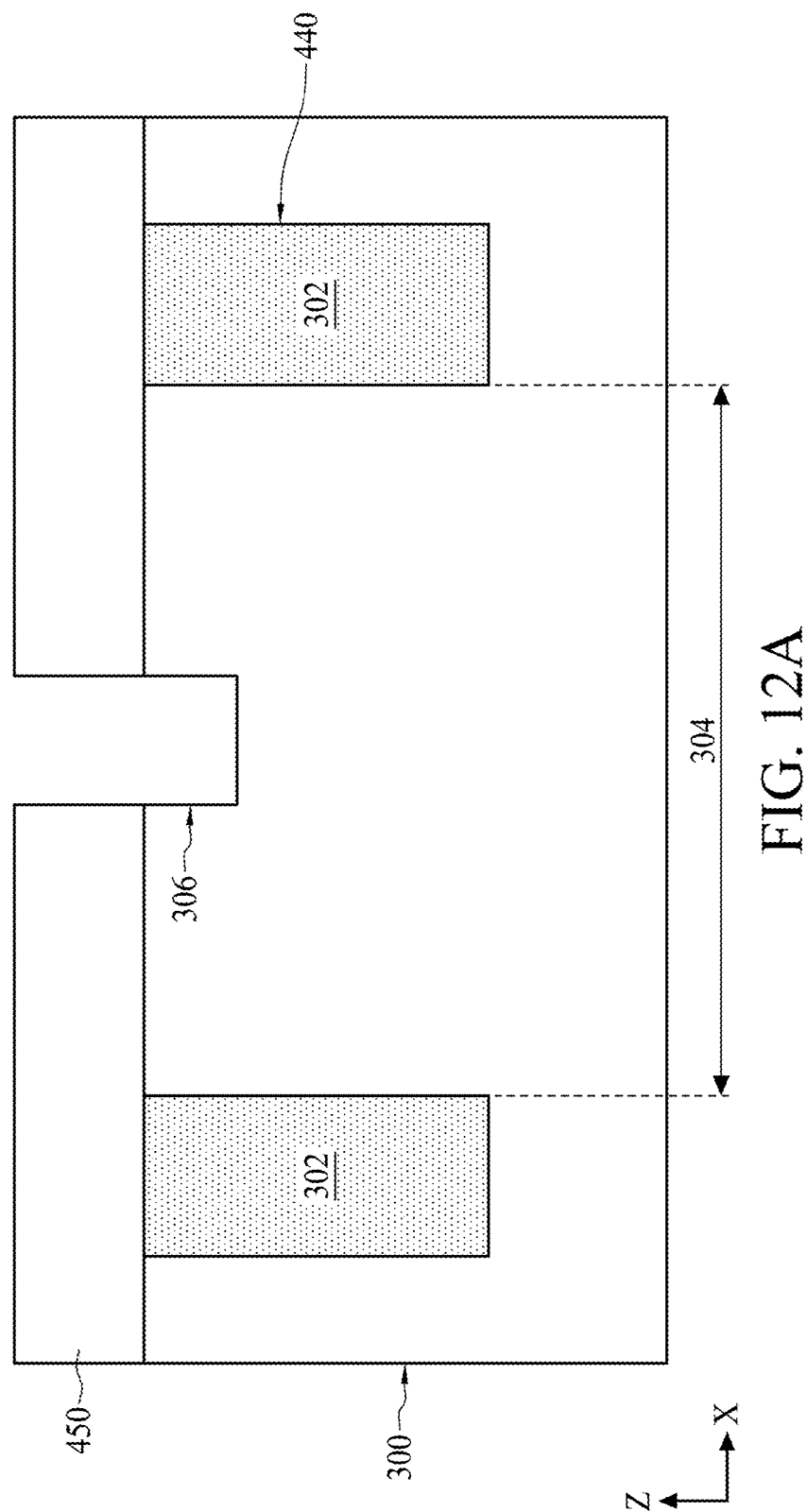
Figure 12B:
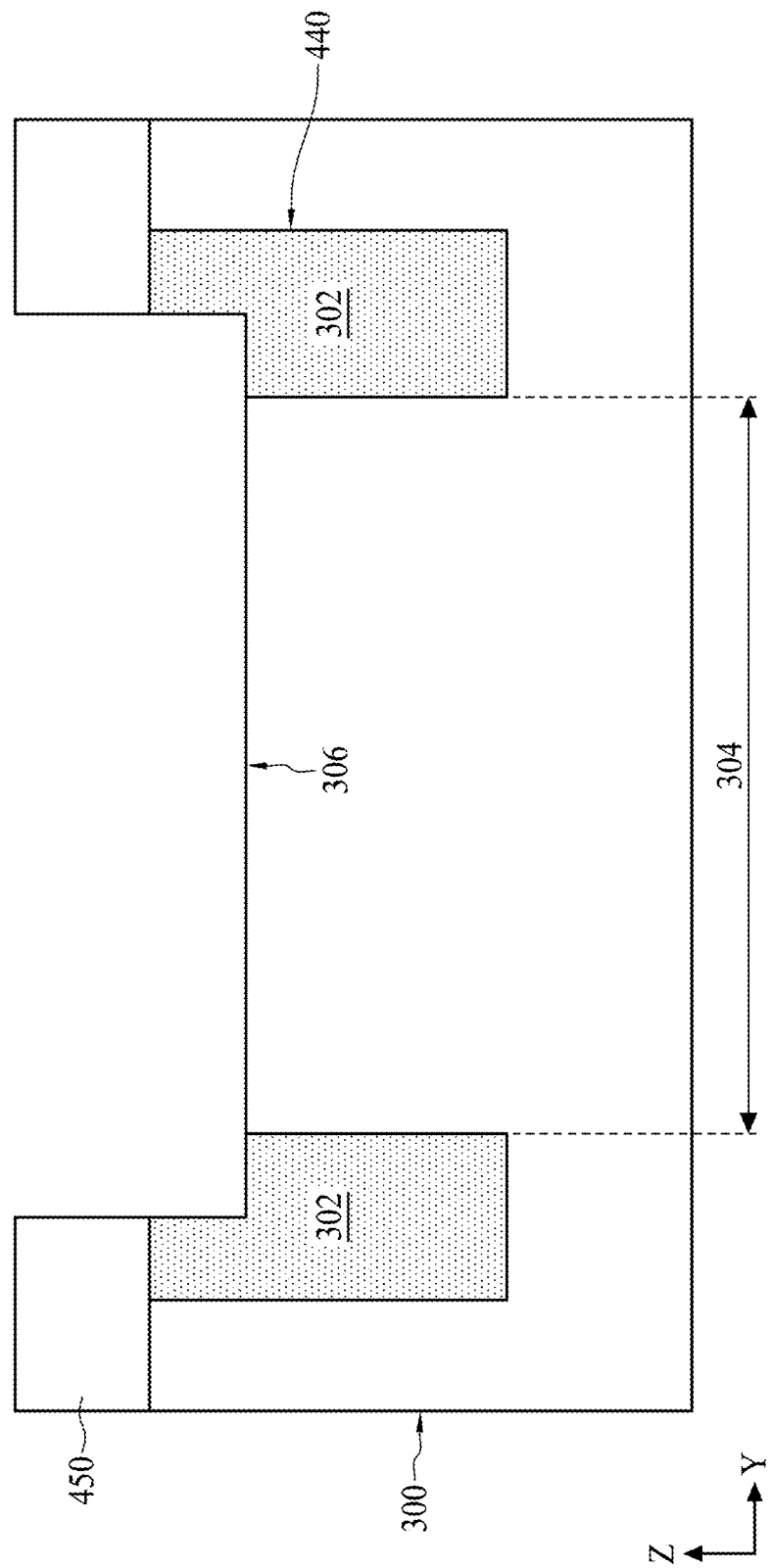

Referring to FIGS. 12A and 12B, in some embodiments, a recess 306 is formed in the substrate 300 according to a step 612 in FIG. 9. In some embodiments, the recess 306 is formed by coating a second etching mask 450 on the substrate 300 and the isolating structures 302 and performing a second etching process to remove portions of the substrate 300 and isolating structures 302 not protected by the second etching mask 450. After the performing of the second etching process, the second etching mask 450 is removed using an ashing process or a wet strip process, for example.

Figure 13A:
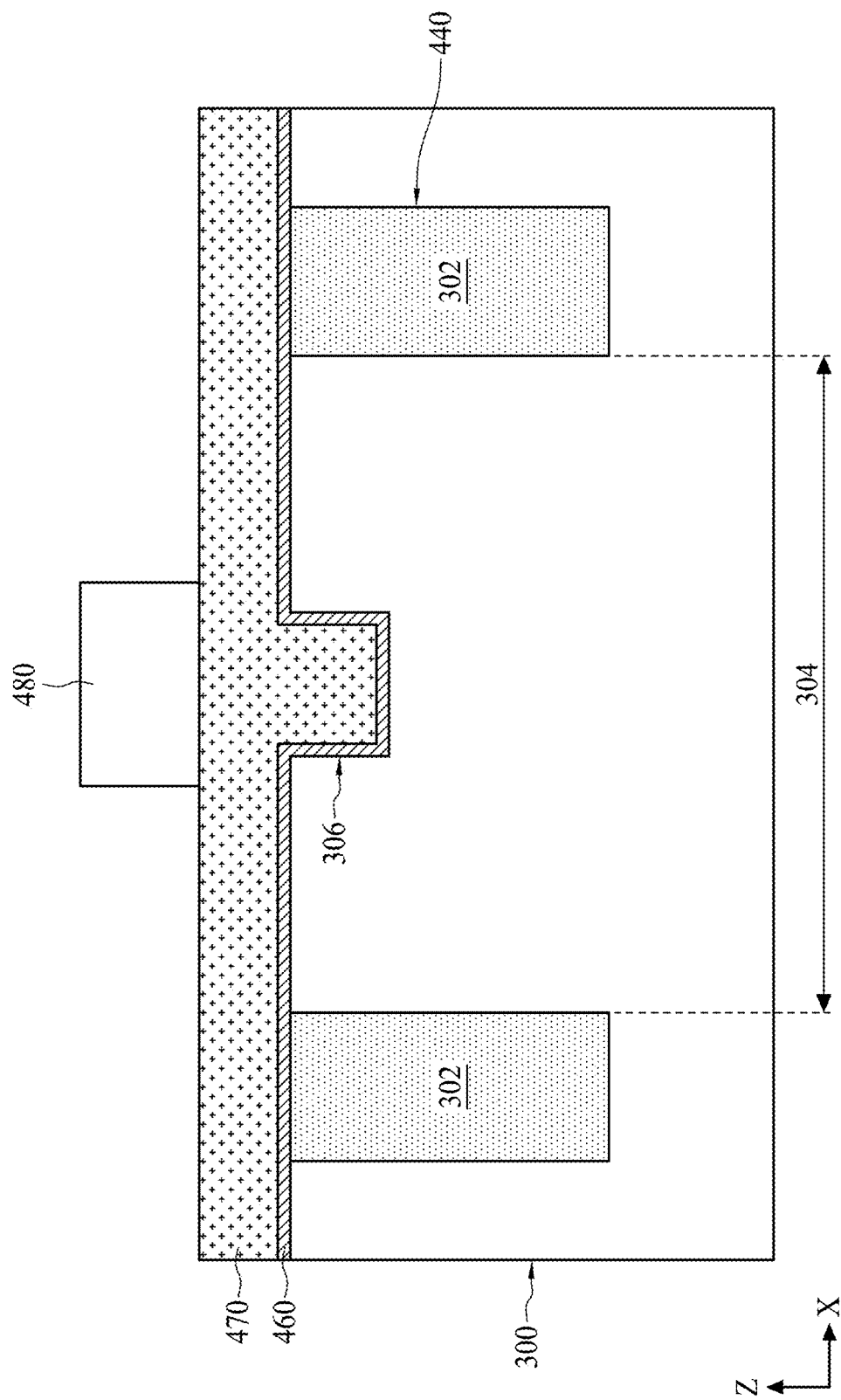
Figure 13B:
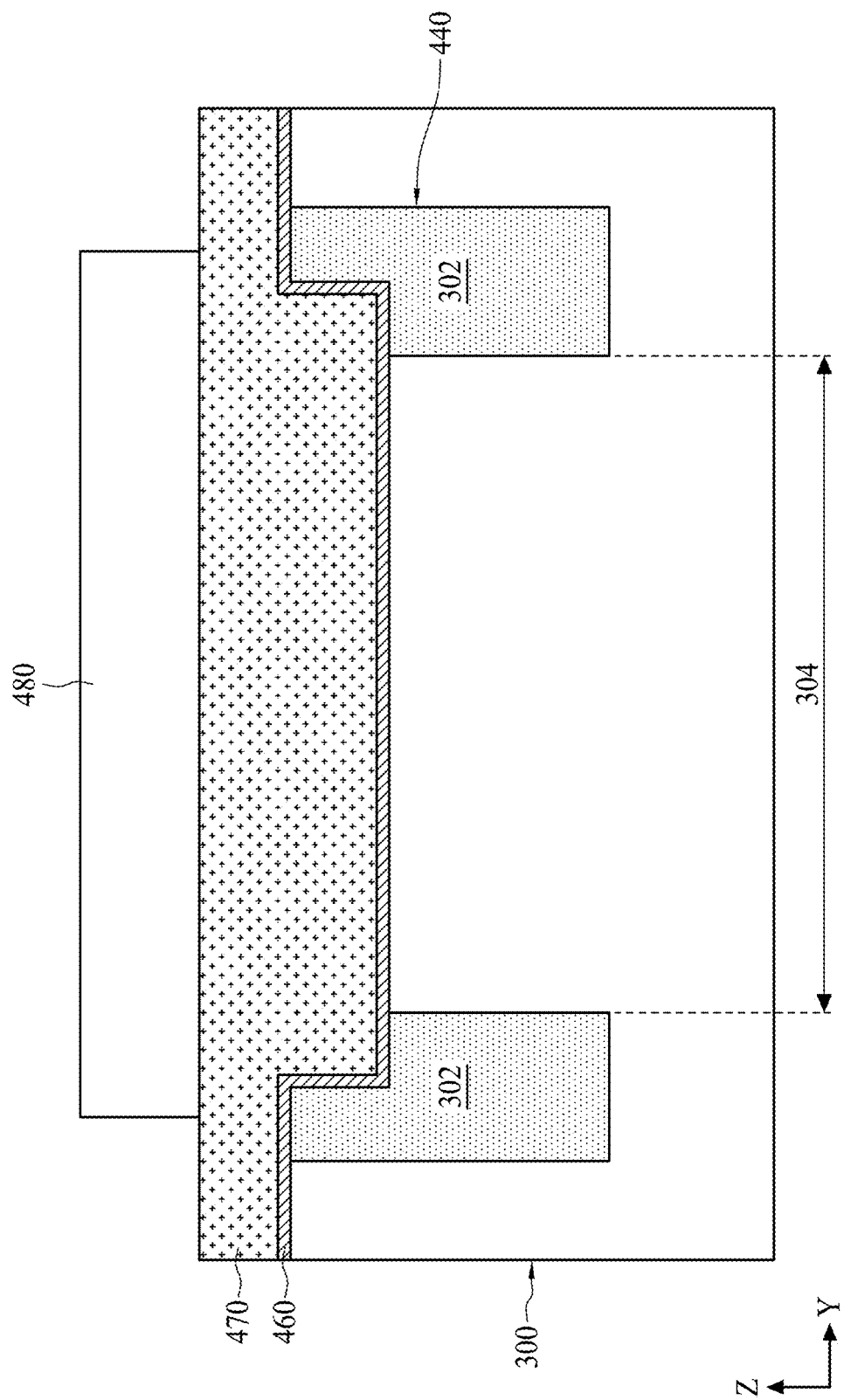

Referring to FIGS. 13A and 13B, in some embodiments, an insulating layer 460 is conformally disposed on the substrate 300 and the isolating structures 302, and a first conductive material 470 is disposed on the insulating layer 460, according to a step 614 in FIG. 9. In some embodiments, the insulating layer 460 has a substantially uniform thickness. In some embodiments, the insulating layer 460, including oxide, nitride or oxynitride, is formed using a CVD process, an atomic layer deposition (ALD) process, or the like. In some embodiments, the first conductive material 470 has a sufficient thickness to fill the recess 306. In some embodiments, the first conductive material 470, including polysilicon or metal, is formed using a CVD process, a physical vapor deposition (PVD) process, an ALD process, or other suitable process.

Figure 14A:
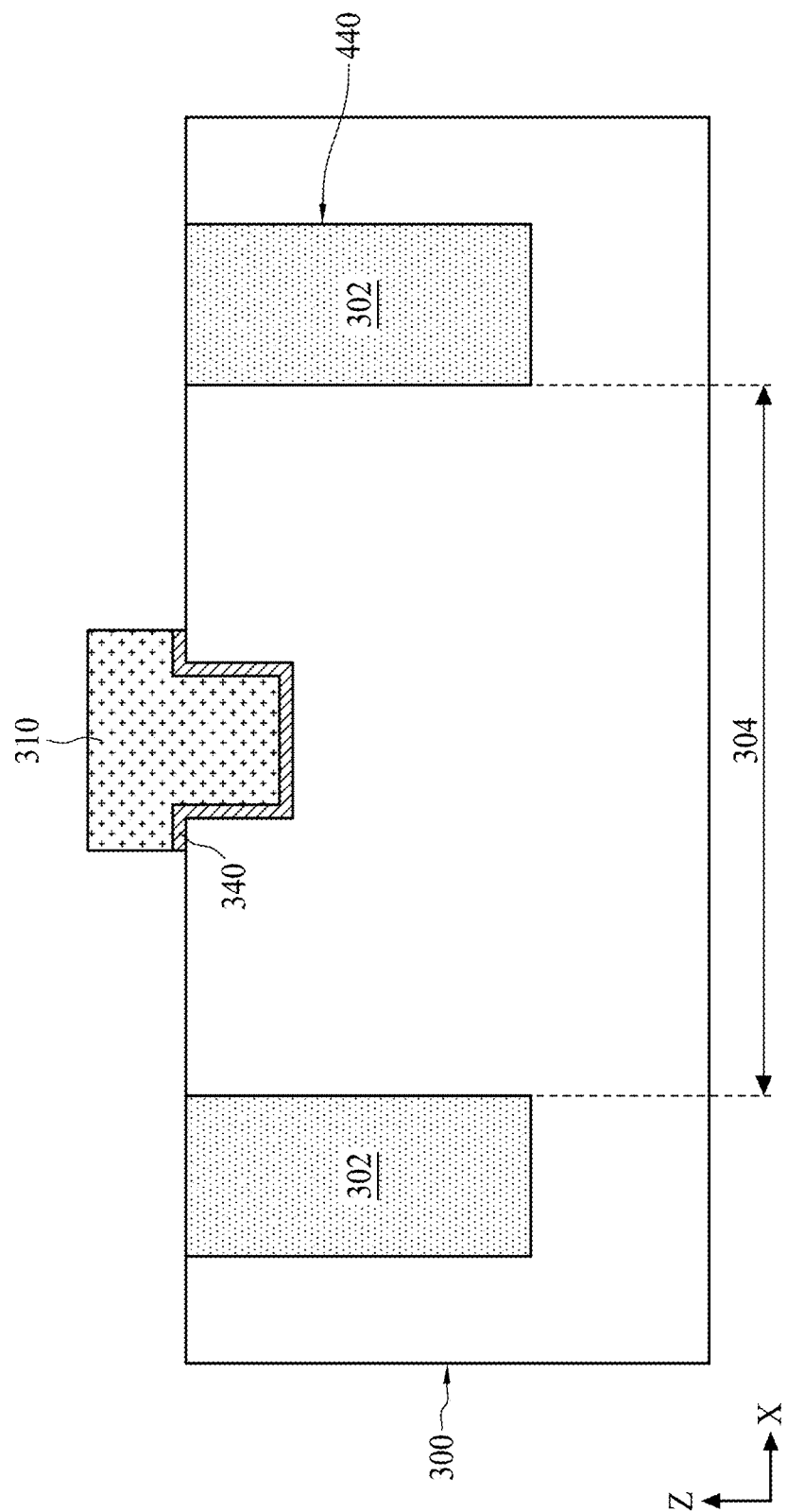
Figure 14B:
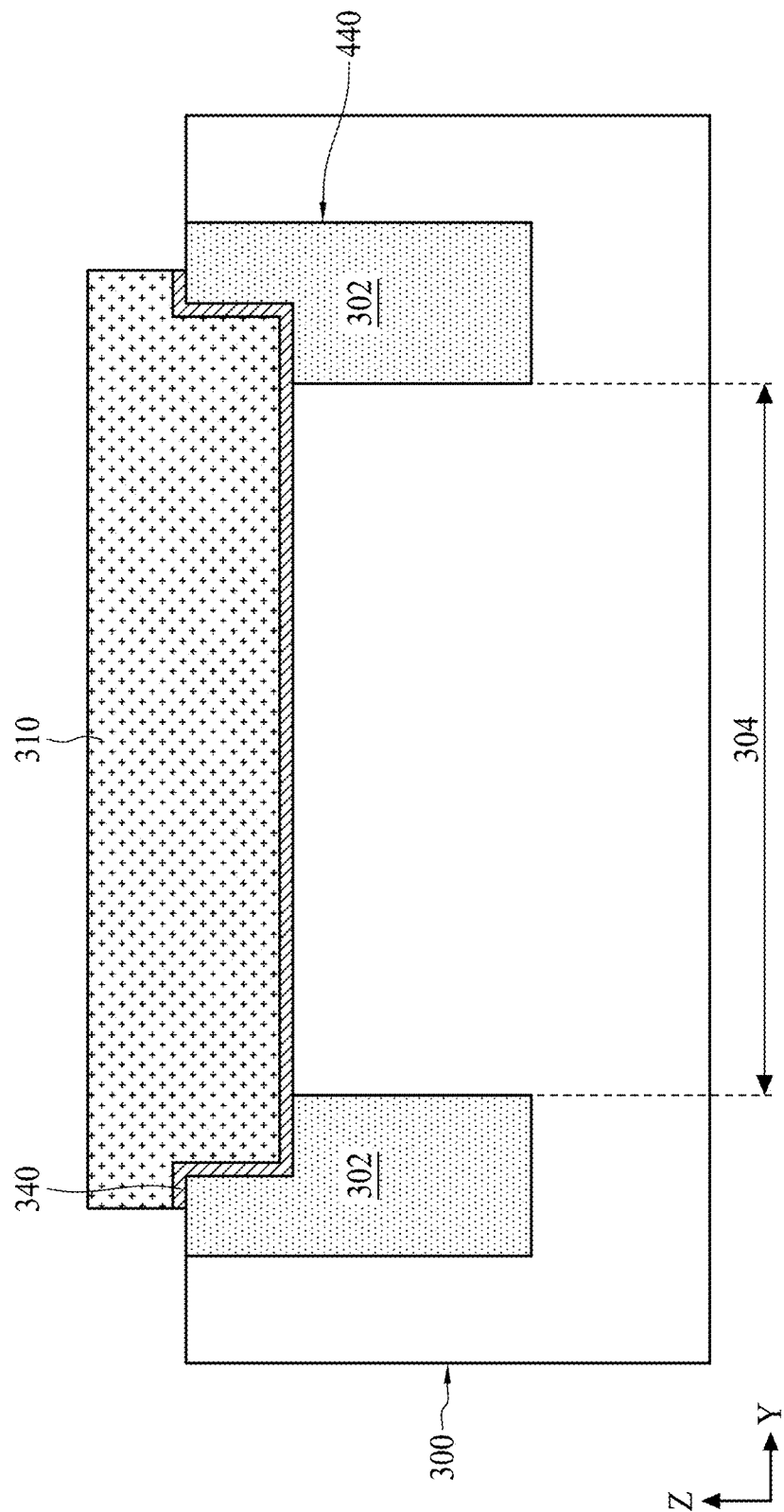

Next, a third etching mask 480 is provided on the first conductive material 470 for a third etching process of the first conductive material 470 and the insulating layer 460 to form a gate electrode 310 and a gate dielectric 340 (as shown in FIGS. 14A and 14B) according to a step 616 in FIG. 9. In some embodiments, portions of the first conductive material 470 and the insulating layer 460 not protected by the third etching mask are removed to expose the substrate 300 and the isolating structure 302. In some embodiments, the third etching process may include two etching steps with an initial etching step selective to the insulating material 460. As shown in FIG. 14B, the gate electrode 310 and the gate dielectric 340 cross the active region 304 and overlaps boundaries between the active region 304 and the isolation structures 302. In some embodiments, the third etching mask 480 is removed after the performing of the third etching process using an ashing process or a wet strip process, for example.

Figure 15:
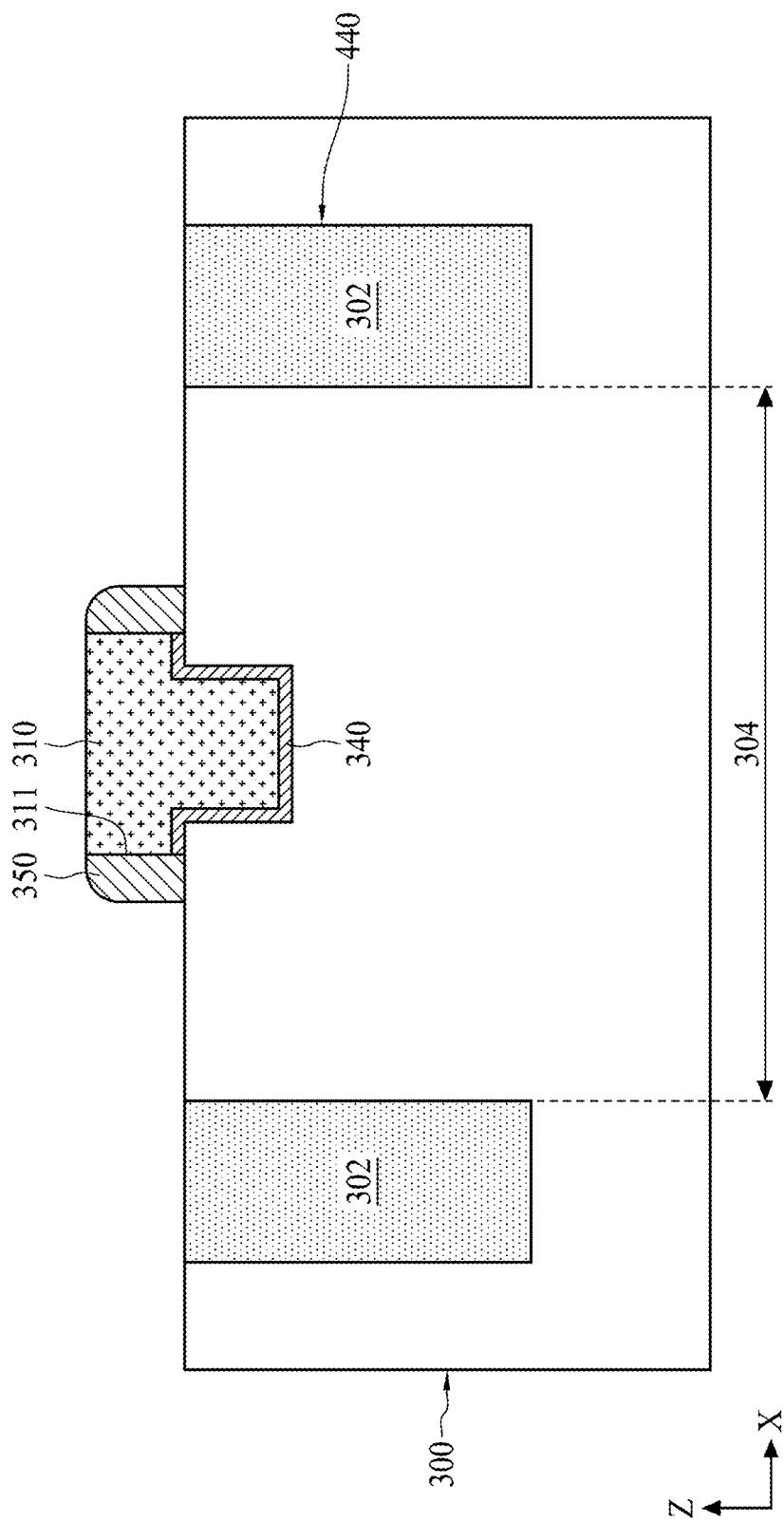

Referring to FIG. 15, in some embodiments, gate spacers 350 on sidewalls 311 of the gate electrode 310 (and the gate dielectric 340) are optionally formed by depositing a spacer material (such as silicon nitride or silicon dioxide) and anisotropically etching to remove the spacer material from horizontal surfaces.

Figure 16:
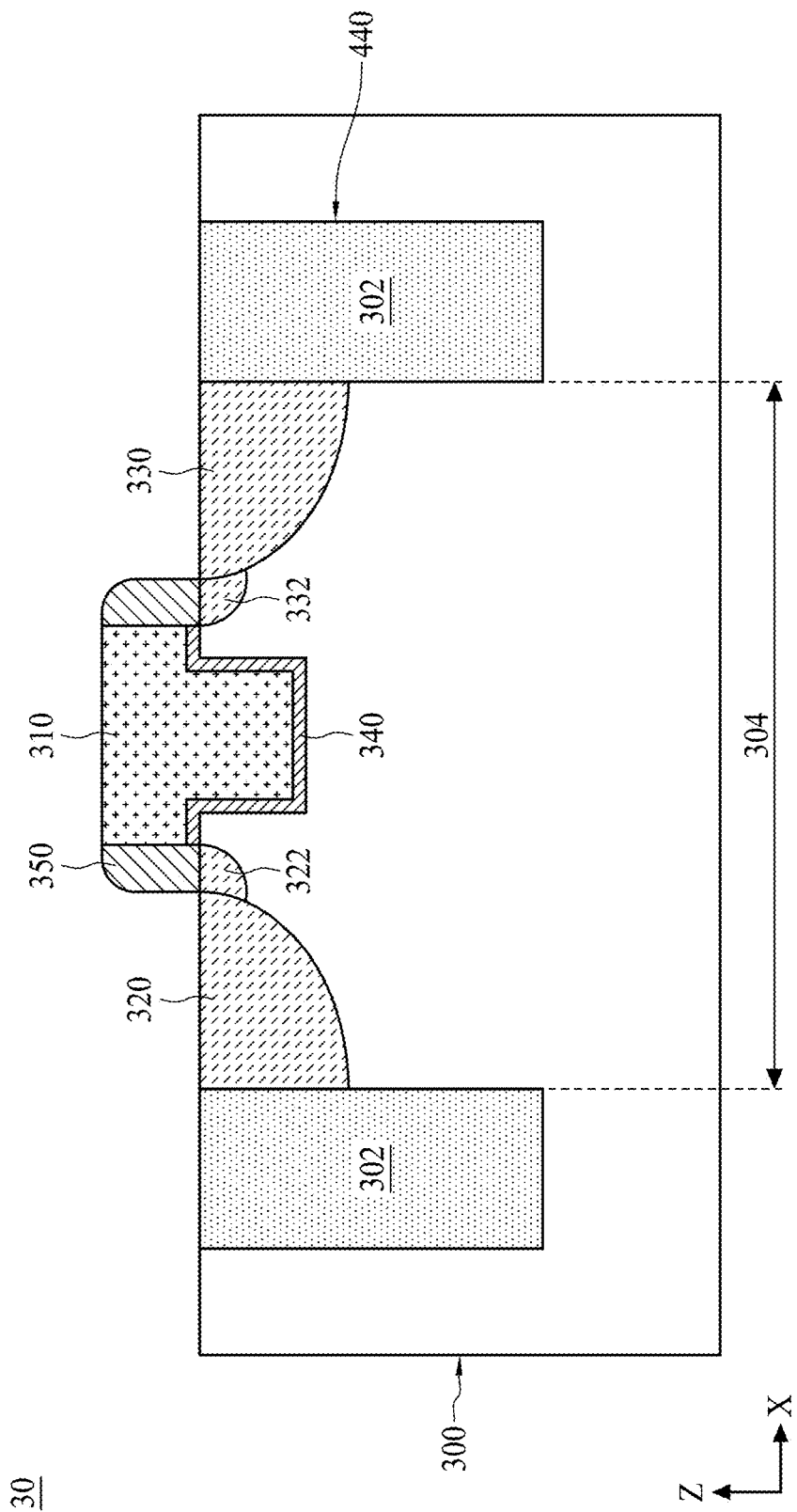

Referring to FIG. 16, in some embodiments, dopants are implanted in the substrate 300 in the active area 304 to form a source region 320 and a drain region 330 according to a step 618 in FIG. 9. Accordingly, the semiconductor device 30 including the transistor is completely formed. In some embodiments, lightly-doped drains (LDD) 322, 332 may be optionally formed by implanting dopants after the forming of the gate electrode 310 but prior to the forming of the gate spacers 350 using the gate electrode 310 and the gate spacers 350 as self-aligning masks.

FIGS. 17 through 23 illustrate the formation of semiconductor devices 30A, 30B and 30C in accordance with alternative embodiments. Unless specified otherwise, the material and formation method of the components in these embodiments are essentially the same as those of the like components, which are denoted by like reference numerals in the embodiments shown in FIGS. 10 through 16. The details of the like components shown in FIGS. 17 and 23 may thus be found in the discussion of the embodiments shown in FIG. 10 through 16.

Figure 17:
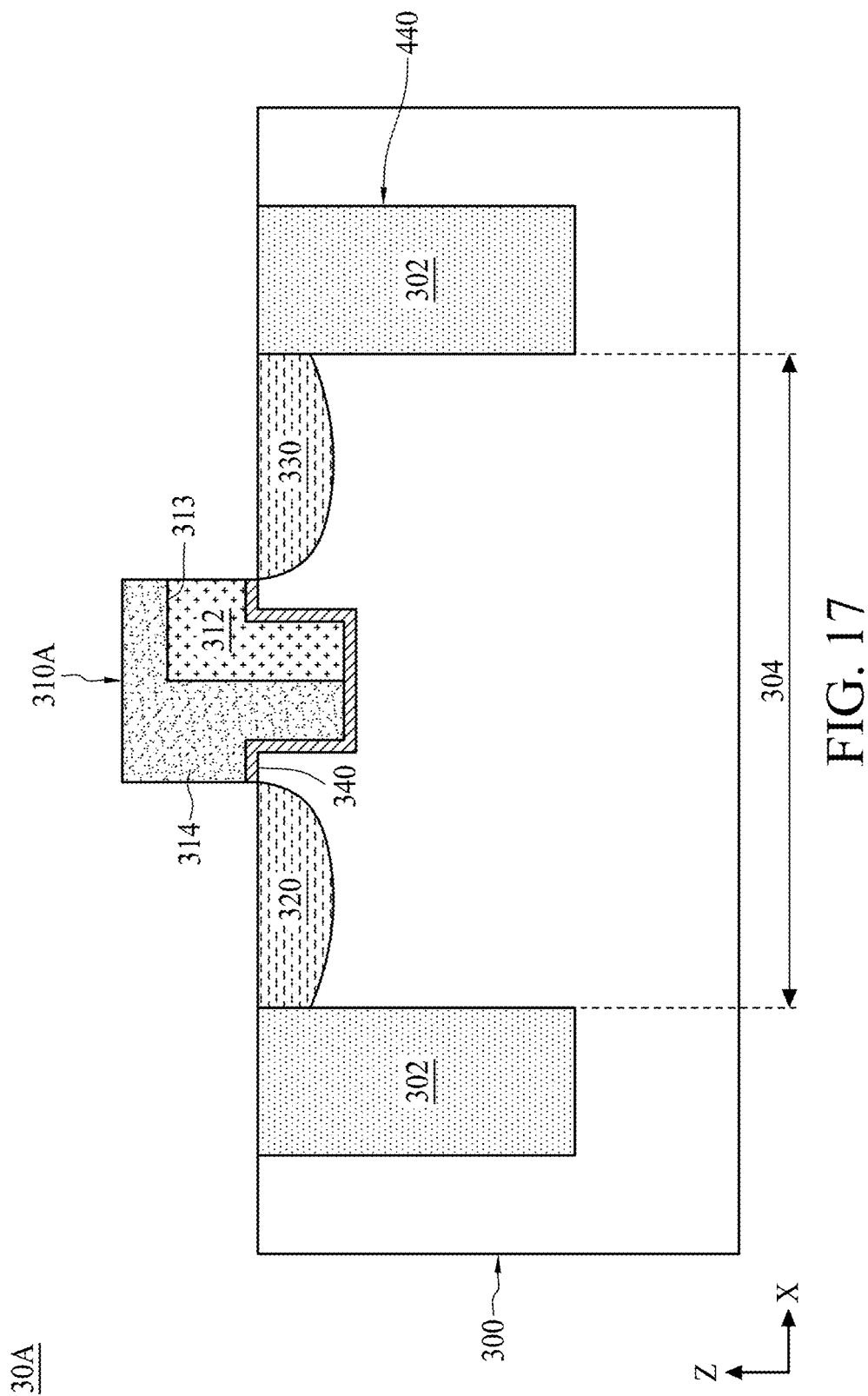
FIG. 17 is a cross-sectional view of a semiconductor device in accordance with some embodiments of the present disclosure.

Referring to FIG. 17, in some embodiments, a gate electrode 310A of the semiconductor device 30A includes a first gate segment 312 being substantially U-shaped and a second gate segment 314 of rectangular shape (as shown in FIG. 5) attached to the first gate segment 312 and covering the first gate segment 312.

Figure 18:
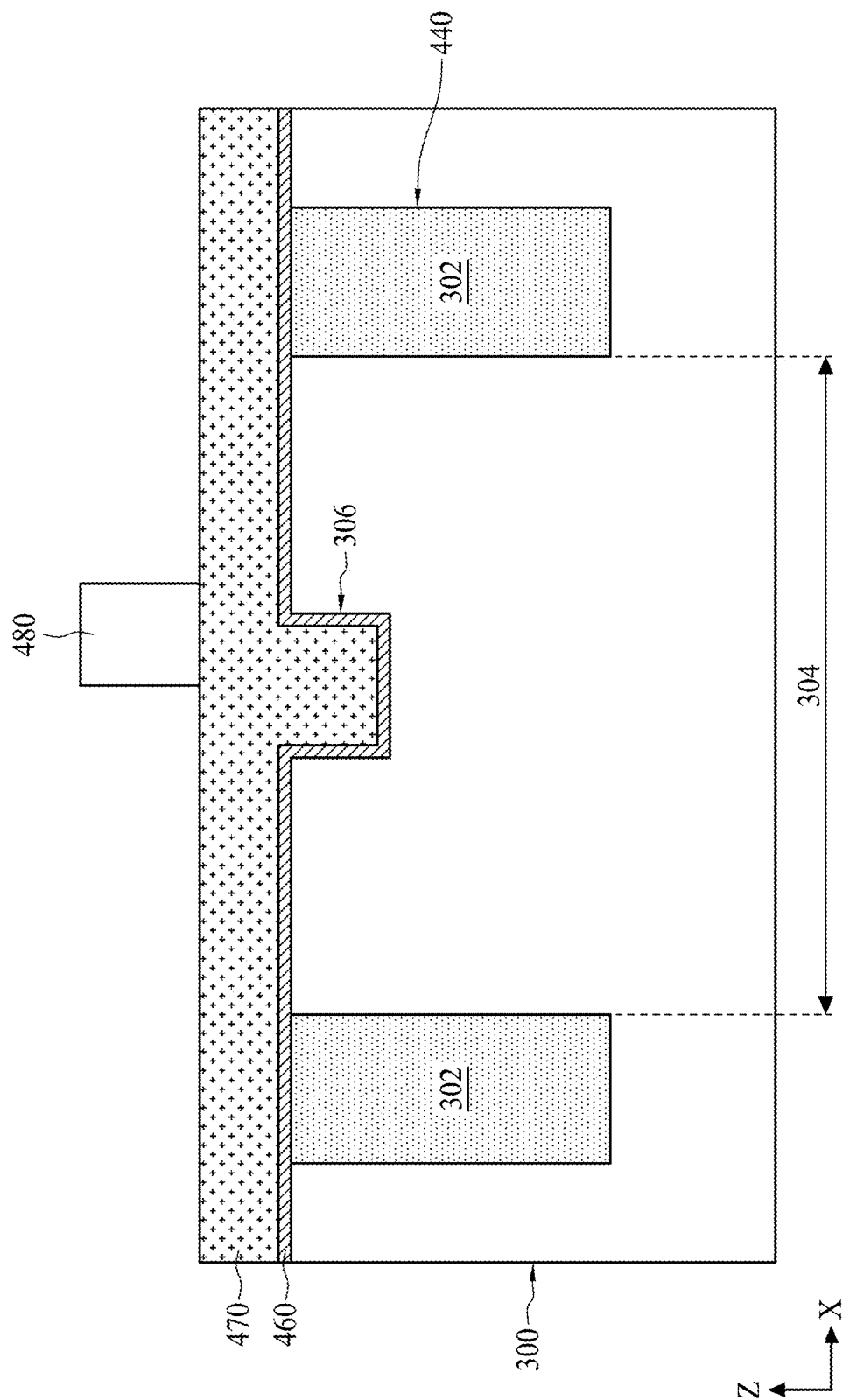
FIGS. 18 through 21 are cross-sectional views of intermediate stages in the formation of a semiconductor device in accordance with some embodiments of the present disclosure.
Figure 19:
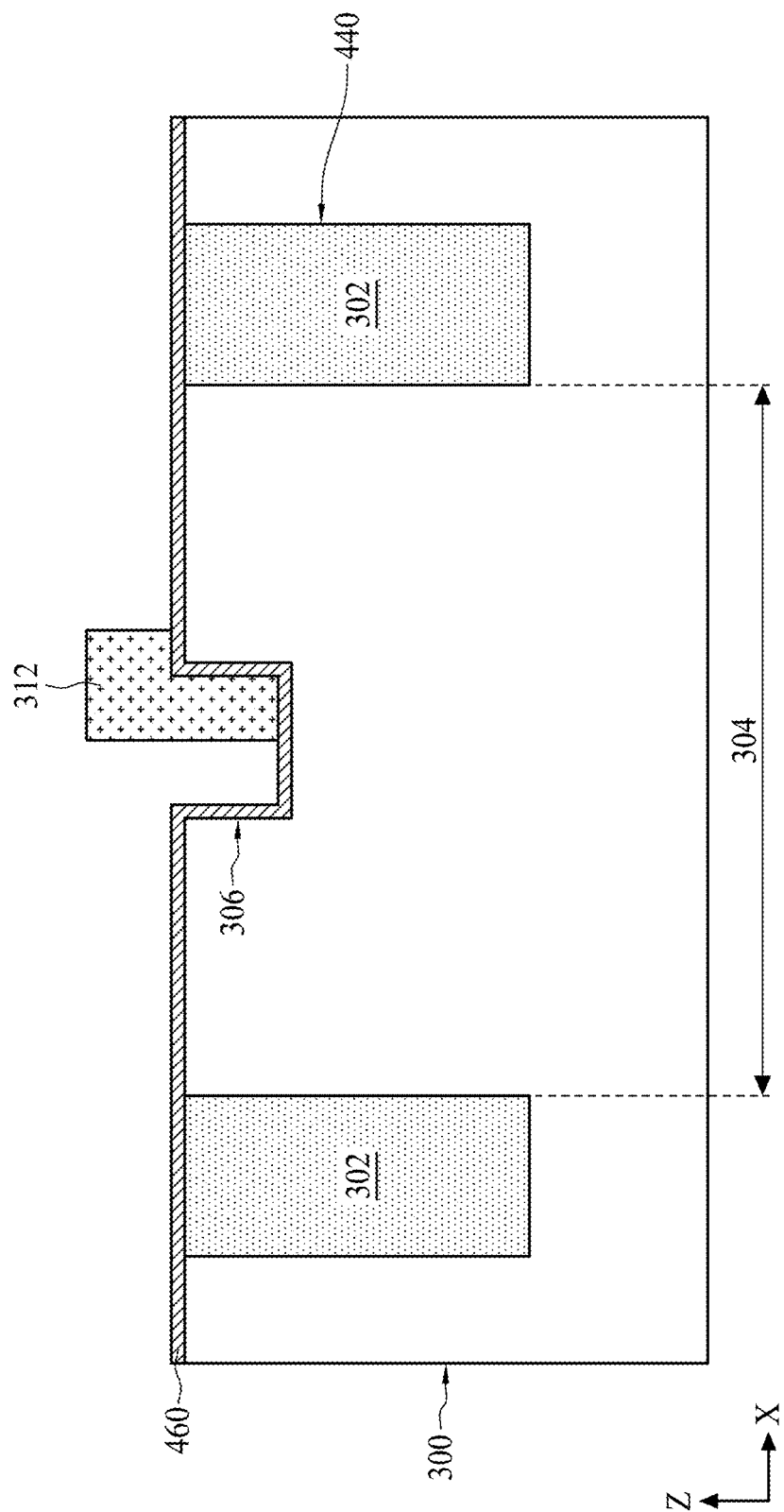
Figure 20:
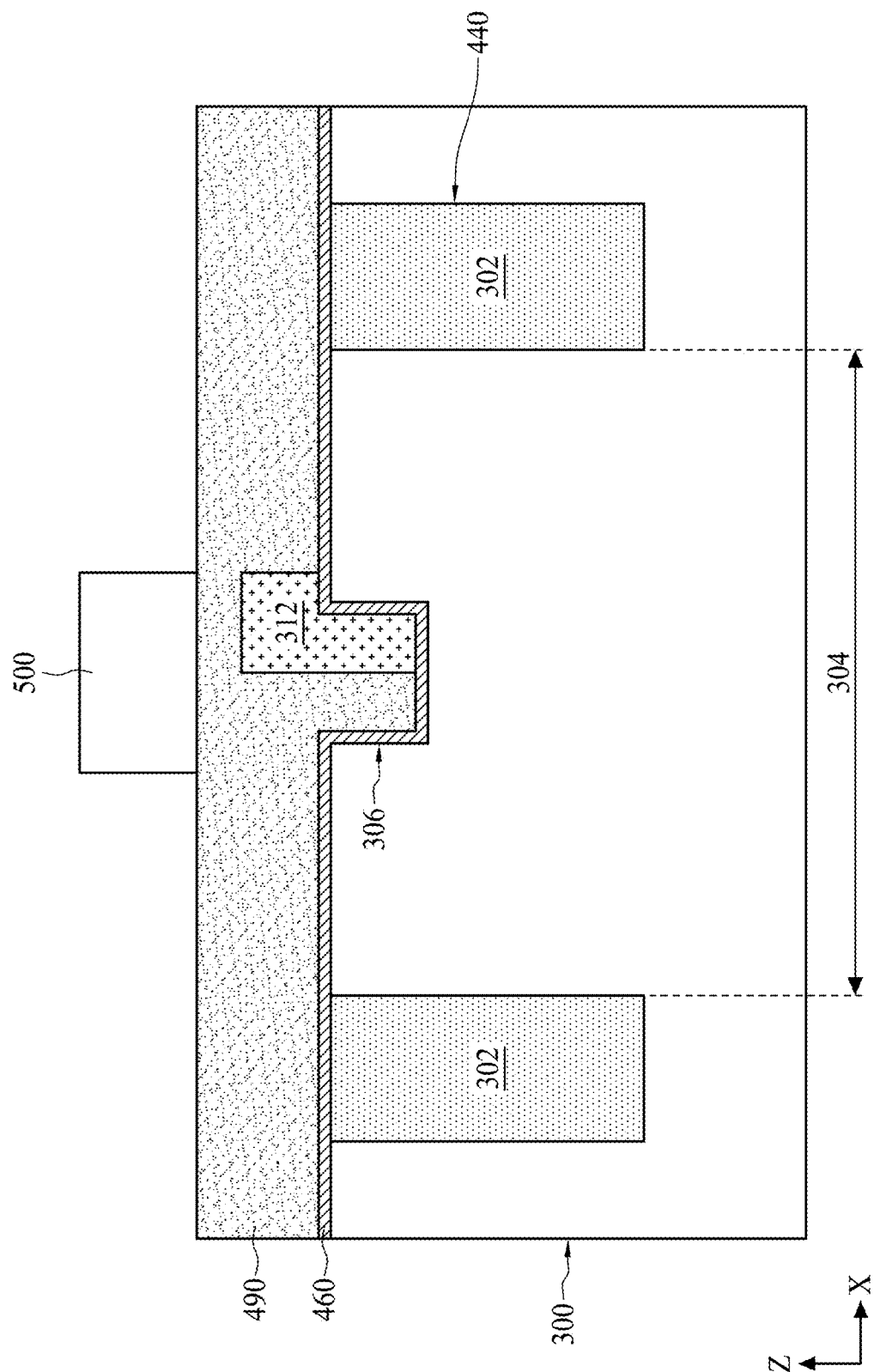

The formation process of the semiconductor device 30A is similar to the process for forming the semiconductor device 30 in FIG. 16, except that the formation of the semiconductor device 30A is started after the insulating layer 460 and the first conductive material 470 are deposited. For example, FIGS. 18 through 20 are cross-sectional views of intermediate stages in the formation of the semiconductor device 30A shown in FIG. 17. In these exemplary embodiments, after formation of the first conductive material 470, a third etching mask 480 is coated on the first conductive material 470.

Next, a third etching process is performed to remove portions of the first conductive material 470 not protected by the third etching mask 480; accordingly, the first gate segment 312 is formed. As shown in FIG. 19, the first gate segment 312 partially fills the recess 306.

Referring to FIG. 20, in some embodiments, a second conductive material 490 is disposed to cover the insulating layer 460 and the first gate segment 312. In some embodiments, the second conductive material 490 has a sufficient thickness to fill the recess 306 exposed through the first gate segment 312. A fourth etching mask 500 is then coated on the second conductive material 490. The second conductive material 490 and the insulating layer 460 are then etched, and the second gate segment 314 and the gate dielectric 340 of the semiconductor device 30A shown in FIG. 17 are thus formed. In some embodiments, the first conductive material 470 and the second conductive material 490 have different work functions, and a difference between the first work function and the second work function is about 0.2 eV. Next, as shown in FIG. 17, the source region 320 and the drain region 330 are formed in the substrate 300 in the active area 304, and the semiconductor device 30A is thus formed.

Figure 21:
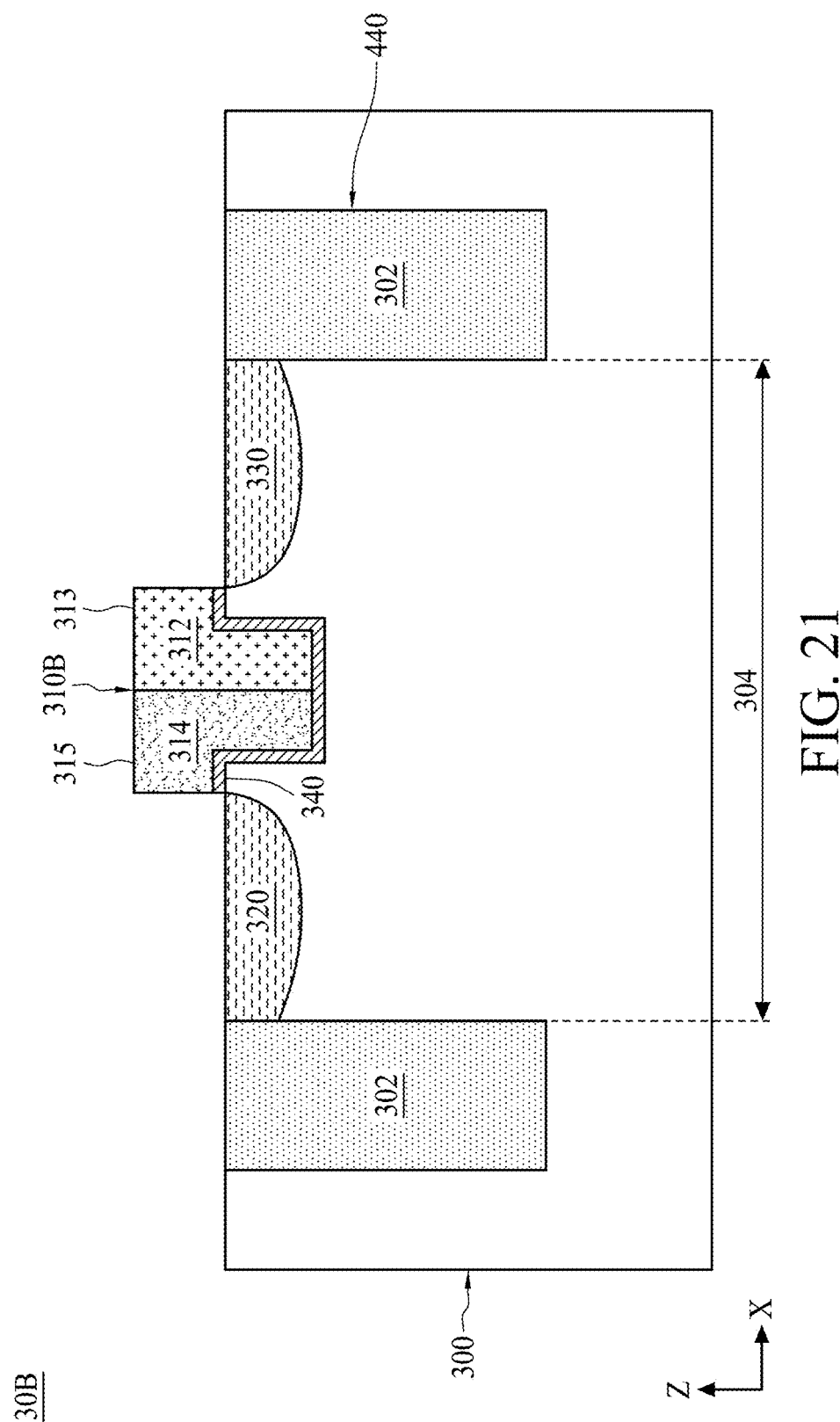

In some embodiments, after the etching of the portions of the second conductive material 490 and the insulating layer 460 and the removal of the fourth etching mask 500 as shown in FIG. 20, the second gate segment 314 above the first gate segment 312 is further planarized to expose a top surface 313 of first gate segment 314, as shown in FIG. 21. After the planarizing of the second gate segment 314, the top surface 313 of the first gate segment 312 is coplanar with a top surface 315 of the second gate segment 314. Next, the source region 320 and the drain region 330 are formed in the substrate 300 in the active area 304. Therefore, the semiconductor device 30B is formed.

Figure 22:
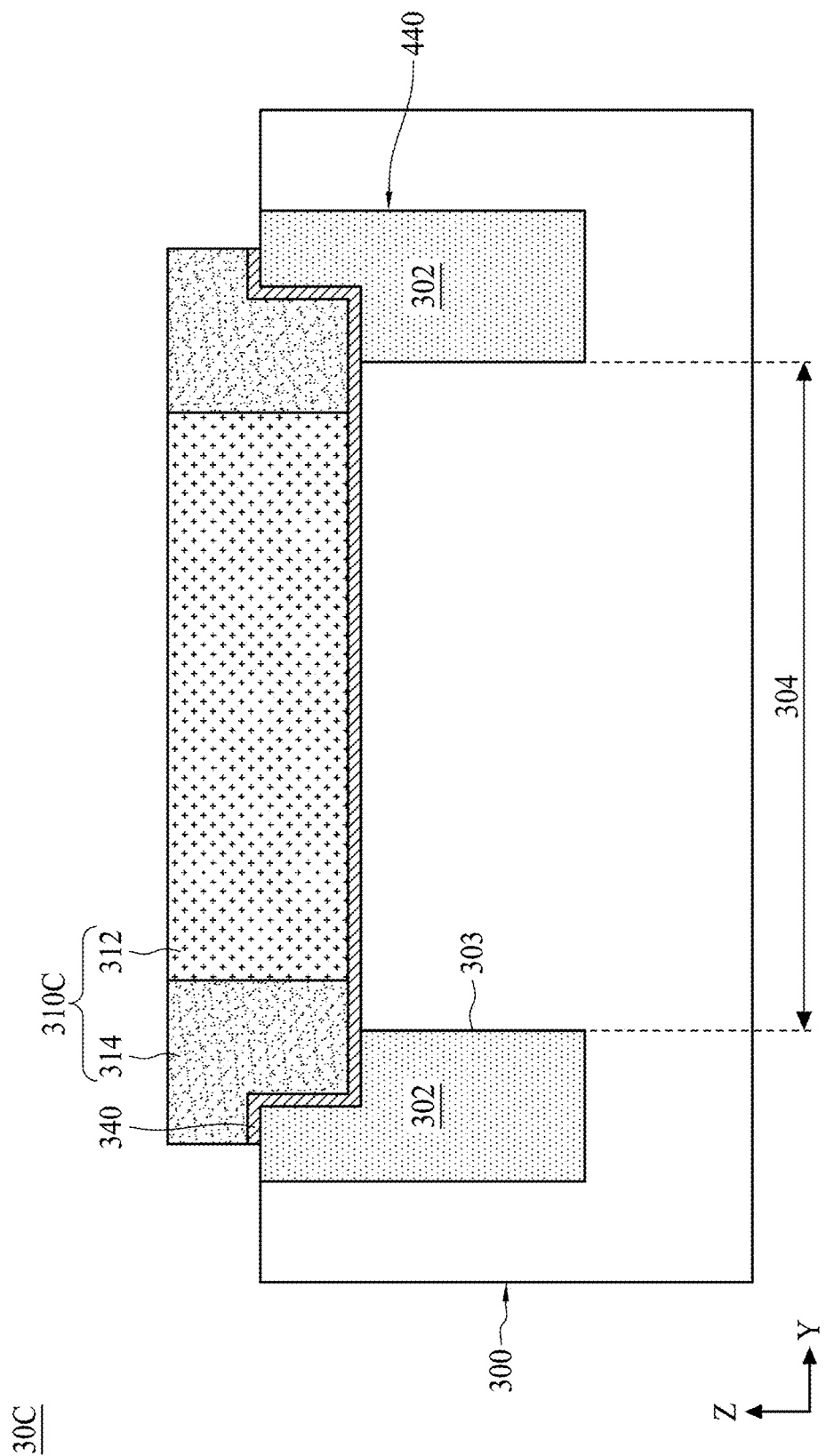
FIG. 22 is a cross-sectional view of a semiconductor device in accordance with some embodiments of the present disclosure.

FIG. 22 is a cross-sectional view of a semiconductor device 30C in accordance with some embodiments of the present disclosure. Referring to FIG. 22, in some embodiments, a gate electrode 310C of the semiconductor device 30C includes a first gate segment 312 disposed on an active area 304 and a plurality of second gate segments 314 on either side of the first gate segment 312 along a longitudinal direction of the first gate segment 312. In some embodiments, the second gate segments 314 cross the active area 304 and overlap at least one boundary 303 between the active area 304 and an isolating structure 302, wherein the active area 304 has an island shape delimited by the isolating structure 302.

The formation process of the semiconductor device 30C is similar to the process for forming the semiconductor device 30 shown in FIG. 16, except that the formation of the semiconductor device 30C is started after the first conductive material 470 is formed. For example, FIGS. 23 and 24 illustrate cross-sectional views of intermediate stages in the formation of the semiconductor device 30C.

Figure 23:
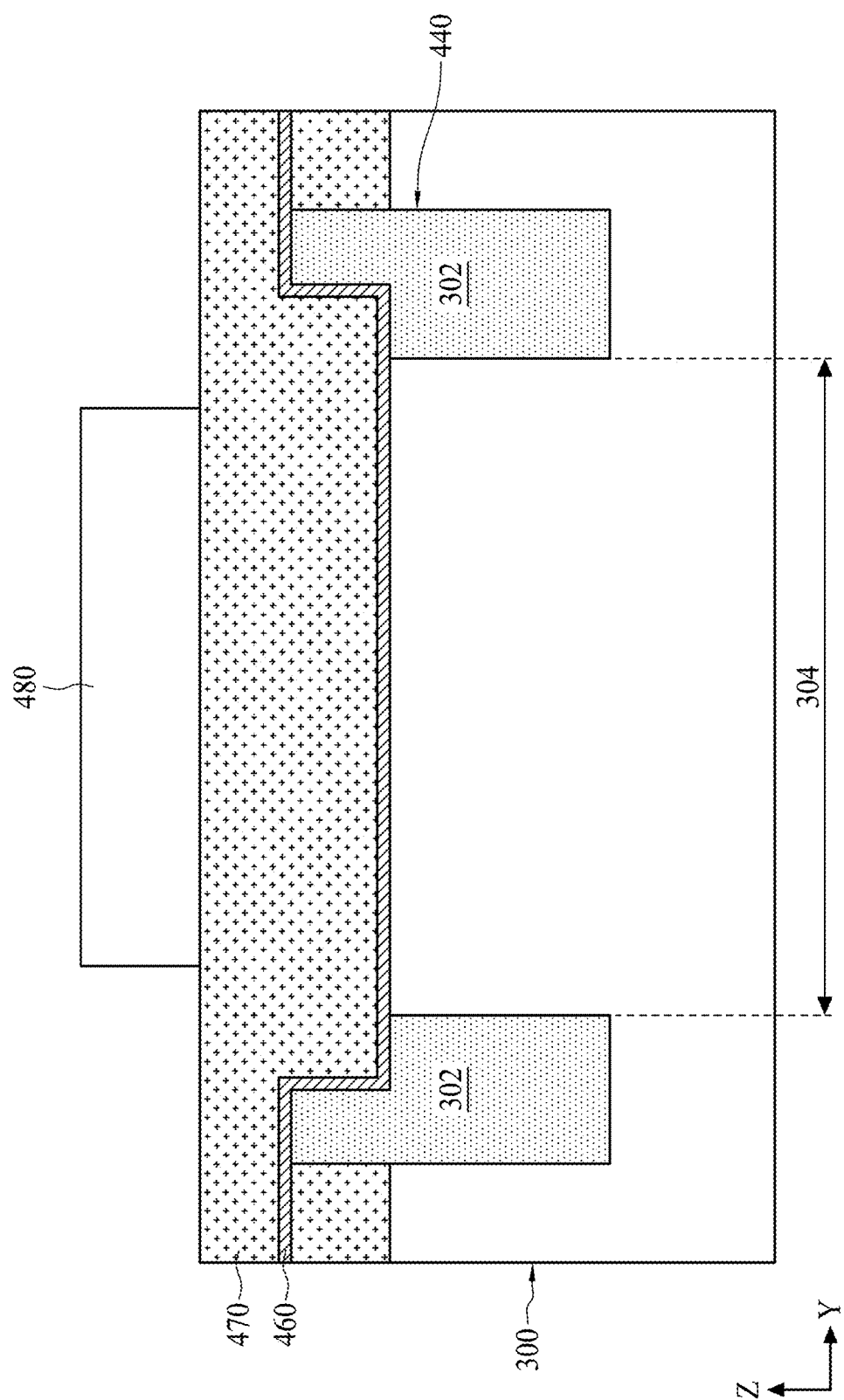
FIGS. 23 and 24 are cross-sectional views of intermediate stages in the formation of a semiconductor device in accordance with some embodiments of the present disclosure.

Referring to FIG. 23, in some embodiments, after the deposition of the first conductive material 470 having a first work function, a third etching mask 480 is coated on the first conductive material 470 to protect or shield a portion of the first conductive material 470 in the active area 304 from being etched. In some embodiments, an anisotropic dry etching process is used to etch the first conductive material 470 and thus form the first gate segment 312 in the active area 304. The third etching mask 480 is then removed from the first gate segment 312.

Figure 24:
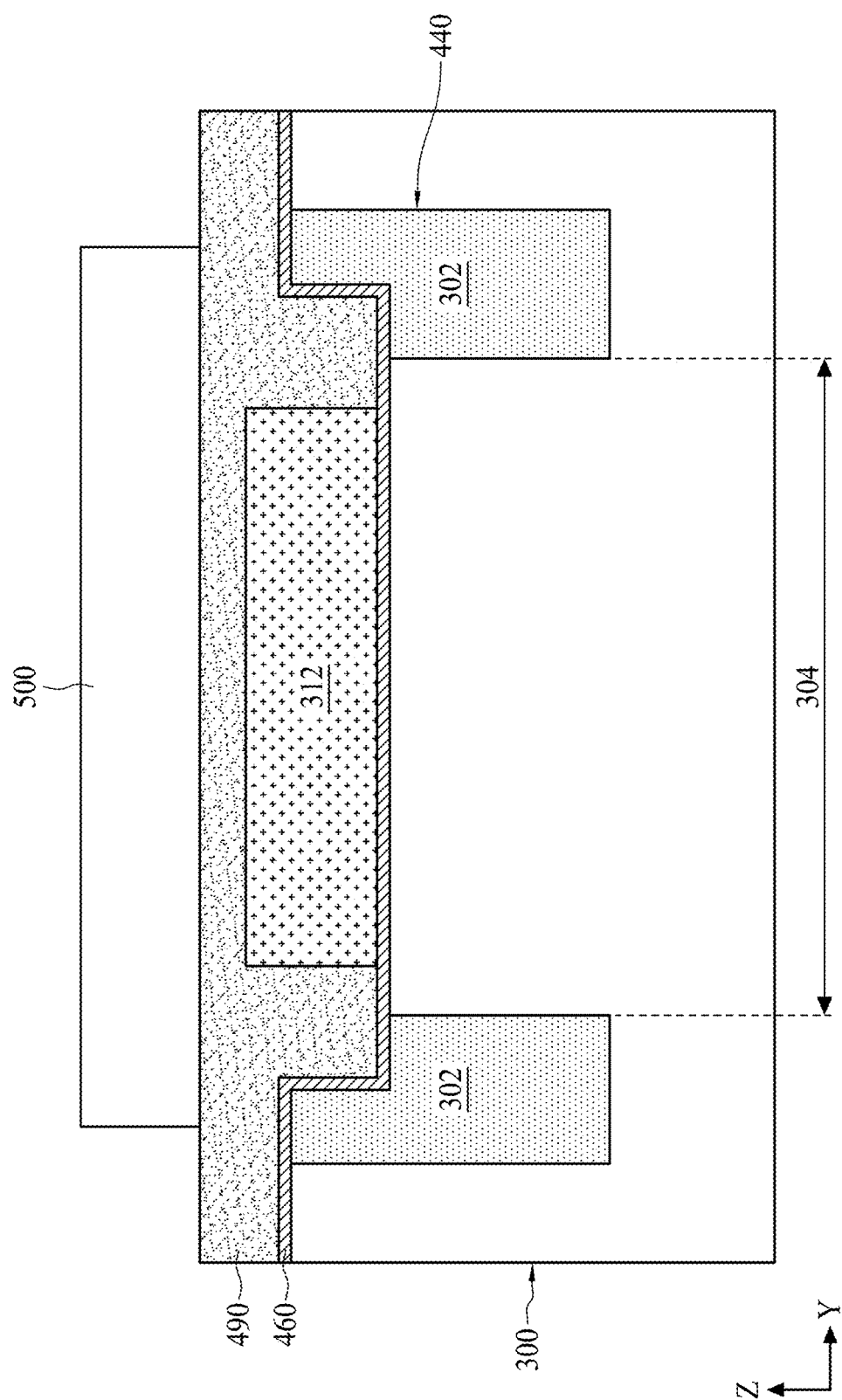

Referring to FIG. 24, in some embodiments, a second conductive material 490 is deposited to cover the insulating layer 460 and the first gate segment 312. In some embodiments, the second conductive material 490 has a sufficient thickness to fill the recess 306 exposed through the first gate segment 312. In some embodiments, the second conductive material 490 has a second work function different from the first work function. In some embodiments, a difference between the first work function and the second work function is about 0.2 eV.

A fourth etching mask 500 is then coated on the second conductive material 490. The second conductive material 490 and the insulating layer 460 are then etched, and the second gate segment 314 and the gate dielectric 340 of the semiconductor device 30C shown in FIG. 22 are formed. Next, the source region 320 and the drain region 330 are formed in the substrate 300 in the active area 304. Therefore, the semiconductor device 30C is formed.

One aspect of the present disclosure provides a semiconductor device. The semiconductor device includes a substrate, a source region, a drain region, and a gate electrode. The source region and the drain region are in the substrate, and the gate electrode is partly buried in the substrate between the source region and the drain region.

One aspect of the present disclosure provides a method of manufacturing a semiconductor device. The method includes steps of forming a recess in the substrate; depositing an insulating layer on the substrate; forming a gate electrode on the insulating layer and partly buried in the recess; removing a portion of the insulating layer exposed through the gate electrode to form a gate dielectric; and implanting dopants in the substrate to form a source region and a drain region on either side of the gate electrode.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate;
   a source region in the substrate;
   a drain region in the substrate; and
   a gate electrode partly buried in the substrate and between the source region and the drain region;
   wherein the gate electrode comprises a first gate segment and at least one second gate segment attached to the first gate segment, wherein the first gate segment and the second gate segment have different work functions;
   wherein a difference between the work functions is substantially 0.2 eV.

2. The semiconductor device of claim 1, wherein the gate electrode is substantially U-shaped.

3. The semiconductor device of claim 1, further comprising an isolating structure in the substrate to define an active area, wherein the gate electrode is partly buried in the isolating structure.

4. The semiconductor device of claim 3, wherein the portion of the gate electrode in the substrate has a first width, and the portion of the gate electrode above the substrate has a second width substantially greater than the first width.

5. The semiconductor device of claim 1, wherein the first gate segment and the second gate segment are made of a same material having different doped concentrations.

6. The semiconductor device of claim 1, wherein the gate electrode includes a plurality of second gate segments on either side of the first gate segment.

7. The semiconductor device of claim 1, wherein the second gate segment is attached to a lateral side of the first gate segment, and top surfaces of the first gate segment and the second gate segment are at the same level.

8. The semiconductor device of claim 1, wherein the second gate segment is attached to a lateral side of the first gate segment, and the second gate segment covers the first gate segment.

* * * * *